(12) United States Patent
Hendrickson et al.

(10) Patent No.: US 7,406,616 B2
(45) Date of Patent: Jul. 29, 2008

(54) DATA DE-SKEW METHOD AND SYSTEM

(75) Inventors: Norm Hendrickson, Colorado Springs, CO (US); Andrew Schmitt, Salem, NH (US); Timothy Coe, Oxnard, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 11/218,331

(22) Filed: Sep. 1, 2005

(65) Prior Publication Data

US 2006/0129869 A1 Jun. 15, 2006

Related U.S. Application Data

(63) Continuation of application No. 10/036,565, filed on Dec. 31, 2001, now abandoned.

(60) Provisional application No. 60/273,763, filed on Mar. 5, 2001, provisional application No. 60/272,635, filed on Feb. 28, 2001, provisional application No. 60/261,868, filed on Jan. 10, 2001, provisional application No. 60/260,628, filed on Jan. 8, 2001, provisional application No. 60/260,079, filed on Jan. 4, 2001, provisional application No. 60/259,968, filed on Dec. 30, 2000.

(51) Int. Cl.
G06F 1/00 (2006.01)
G06F 1/04 (2006.01)
G06F 1/24 (2006.01)
G06F 11/00 (2006.01)
H04J 3/06 (2006.01)

(52) U.S. Cl. ............ 713/500; 713/503; 370/508
(58) Field of Classification Search ............ 713/500
See application file for complete search history.

(56) References Cited

U.S. PATENT DOCUMENTS

| 4,482,826 | A | * | 11/1984 | Ems et al. | ............ 327/270 |
| 4,677,618 | A | | 6/1987 | Haas et al. | |
| 4,918,405 | A | | 4/1990 | Herleikson | |
| 4,926,447 | A | | 5/1990 | Corsetto et al. | |
| 4,970,609 | A | | 11/1990 | Cunningham et al. | |
| 5,193,164 | A | | 3/1993 | Shon | |
| 5,295,164 | A | | 3/1994 | Yamamura | |

(Continued)

FOREIGN PATENT DOCUMENTS

EP 0 665 651 A2 8/1995

(Continued)

OTHER PUBLICATIONS

International Search Report for International Application No. PCT/US01/50011, filed Dec. 31, 2001, Mailed Jun. 27, 2002 (3 pgs).

(Continued)

*Primary Examiner*—Rehana Perveen
*Assistant Examiner*—Michael J Brown
(74) *Attorney, Agent, or Firm*—Christie, Parker & Hale, LLP

(57) ABSTRACT

Systems and methods for deskewing parallel data lines using at least one extra channel in parallel to the parallel data lines to carry data for comparing to data on the parallel data lines.

11 Claims, 33 Drawing Sheets

U.S. PATENT DOCUMENTS

| | | | |
|---|---|---|---|
| 5,313,501 A * | 5/1994 | Thacker | 375/369 |
| 5,329,559 A | 7/1994 | Wong et al. | |
| 5,455,847 A | 10/1995 | Guilford et al. | |
| 5,467,346 A * | 11/1995 | Ito et al. | 370/403 |
| 5,592,519 A | 1/1997 | Honaker, Jr. | |
| 5,610,954 A | 3/1997 | Miyashita et al. | |
| 5,663,666 A | 9/1997 | Chu et al. | |
| 5,689,530 A | 11/1997 | Honaker, Jr. | |
| 5,822,386 A | 10/1998 | Pawelski | |
| 5,889,828 A | 3/1999 | Miyashita et al. | |
| 5,905,759 A | 5/1999 | Ishida et al. | |
| 5,936,445 A | 8/1999 | Babanezhad et al. | |
| 5,952,853 A | 9/1999 | Willingham et al. | |
| 5,953,386 A | 9/1999 | Anderson | |
| 5,963,069 A | 10/1999 | Jefferson et al. | |
| 5,966,033 A | 10/1999 | Miller | |
| 5,987,085 A | 11/1999 | Anderson | |
| 6,028,903 A | 2/2000 | Drost et al. | |
| 6,031,847 A * | 2/2000 | Collins et al. | 370/508 |
| 6,041,090 A | 3/2000 | Chen | |
| 6,044,121 A | 3/2000 | Nolan et al. | |
| 6,079,035 A * | 6/2000 | Suzuki et al. | 714/700 |
| 6,104,326 A | 8/2000 | Lee et al. | |
| 6,124,996 A | 9/2000 | Fasen et al. | |
| 6,266,799 B1 | 7/2001 | Lee et al. | |
| 6,292,116 B1 | 9/2001 | Wang et al. | |
| 6,307,906 B1 | 10/2001 | Tanji et al. | |
| 6,310,498 B1 | 10/2001 | Larsson | |
| 6,310,521 B1 | 10/2001 | Dalmia | |
| 6,316,966 B1 | 11/2001 | Chang et al. | |
| 6,317,008 B1 | 11/2001 | Gabara | |
| 6,324,236 B1 | 11/2001 | Bladh | |
| 6,327,318 B1 | 12/2001 | Bhullar et al. | |
| 6,463,109 B1 * | 10/2002 | McCormack et al. | 375/355 |
| 6,606,576 B2 * | 8/2003 | Sessions | 702/107 |
| 6,691,214 B1 * | 2/2004 | Li et al. | 713/600 |
| 2005/0069041 A1 * | 3/2005 | Lincoln | 375/257 |

FOREIGN PATENT DOCUMENTS

| | | |
|---|---|---|
| EP | 0 901 126 A1 | 3/1999 |
| WO | WO 98/44673 | 10/1998 |
| WO | WO 99/67882 | 12/1999 |

OTHER PUBLICATIONS

P. Dartnell, "16 Lane SUPI—An Implementation of OC768 SFI-5 Interface", Contribution No. OIF 2000.224, Optical Internetworking Forum, Nov. 2000 (13 pages).

P. Dartnell, et al., "Serdes Framer Interface Level 5 (SFI-5): Implementation Agreement For 40Gb/s Interface For Physical Layer Devices", Contribution No. OIF 2001.145.1, Optical Internetworking Forum, Apr. 20, 2001 (29 pgs).

P. Dartnell, et al., "Serdes Framer Interface Level 5 (SFI-5): Implementation Agreement For 40Gb/s Interface For Physical Layer Devices", Contribution No. OIF 2001.145.9, Optical Internetworking Forum, Nov. 7, 2001 (54 pgs).

P. Dartnell, et al., Comment Resolution For Technical Committee Straw Ballot#17 Serdes Framer Interface Level 5 (SFI-5), Contribution No. OIF 2001.566, Optical Internetworking Forum, Oct. 2001.

P. Dartnell, "SFI-5 Draft 4.0: Editors Summary and Report", Contribution No. OIF 2001.572, Optical Internetworking Forum, Nov. 1, 2001 (8 pgs).

M. Hellwig, "A Proposal For A 40GBps Interface (SFI-5)", Contribution No. OIF 2000.265, Optical Internetworking Forum, Nov. 6, 2000 (7 pgs).

H. Johansen, et al., "SFI-5, OC-768 Framers-Serdes I/F Characteristics", Contribution No. OIF 2000.227, Optical Internetworking Forum, Nov. 7, 2000 (7 pgs).

J. Lynch (ed.), "OC-768 SFI-5 Ad Hoc Report", Contribution No. OIF 2000.314 Optical Internetworking Forum, Nov. 16, 2000 (12 pgs).

W. Mok, et al., "SFI-5: Common Electrical Interface Between Framers and Serialzer/Deserializer Parts for STS-768/STM-192 Interfaces", Contribution No. OIF2000.276, Optical Internetworking Forum, Nov. 2000 (25 pgs).

T. Palkert, et al., "SFI-5: Common Electrical Interface Between Framers and Serializer/Deserializer Parts for STS-768/STM-256 Interfaces", Contribution No. OIF 2000.255, Optical Internetworking Forum, Oct. 2000 (19 pgs).

T. Palkert, et al., "SxI-5: Electrical Characteristics of Common I/O for SFI-5 and SPI-5", Contribution No. OIF 2001.149.5, Optical Internetworking Forum, Nov. 5, 2001 (38 pgs).

J. Pertessis, "SFI-5 Proposal For A 40Gb/s Interface", Contribution No. OIF 2001.139, Optical Internetworking Forum, Mar. 2001 (15 pgs).

W. Dally, et al., "Digital Systems Engineering", Cambridge University Press, U.K., 1998, pp. 633-641 (11 pgs).

* cited by examiner

| A1<br>11110110 | A1<br>11110110 | A2<br>00101000 | A2<br>00101000 |
|---|---|---|---|
| CH<br>XXXXXXXX | SL<br>XXXXXXXX | ST0<br>XXXXXXXX | ST1<br>XXXXXXXX |
| D00<br>XXXXXXXX | D01<br>XXXXXXXX | D02<br>XXXXXXXX | D03<br>XXXXXXXX |
| D10<br>XXXXXXXX | D11<br>XXXXXXXX | D12<br>XXXXXXXX | D13<br>XXXXXXXX |

FIG. 28

DATA DE-SKEW METHOD AND SYSTEM

CROSS-REFERENCE TO RELATED APPLICATIONS

This application is a continuation of patent application Ser. No. 10/036,565, filed Dec. 31, 2001 now abandoned and claims the benefit of U.S. provisional application Nos. 60/259,968 filed Dec. 30, 2000, 60/260,079 filed Jan. 4, 2001, 60/260,628 filed Jan. 8, 2001, 60/261,868, filed Jan. 10, 2001, 60/272,635, filed Feb. 28, 2001, and 60/273,763, filed Mar. 5, 2001 which are hereby incorporated by reference as if set forth in full herein.

BACKGROUND OF THE INVENTION

The present invention relates generally to parallel data alignment, and more particularly to synchronization of high speed parallel data transmissions.

The capabilities of information processing systems are constantly expanding. Such systems are increasingly called upon to process large amounts of information very quickly. The ability of information processing systems to act on information is dependent on the rate at which the system may receive information and the speed at which the system can process that information. In order to receive information more quickly, the systems are often provided information on parallel data lines. The information provided on the parallel data lines is generally associated together to form blocks of information. The use of parallel data lines allows a system to receive multiple pieces of information at any given moment.

A problem with parallel data lines is that transmission times across the data lines may vary, or skew, due to line lengths, process variations, aging, and environmental conditions. If the data transmission times are sufficiently different, then the information processing system may not group pieces of information received on the data lines in the proper format. The increased rate at which information processing systems process information also results in a decreased tolerance of variation in data transmission time. Thus, if information processing speeds increased by a factor of 10, such has occurred in the last several years, the allowable variation in transmission time decreases significantly.

Furthermore, information processing systems have increasingly been linked in ever greater computer networks, such as the Internet. The demand for information across these networks is tremendous, and has largely been met by ever increasing the rate in which information has passed between network nodes. For example, fiber optic transmission systems have increased data throughput such that data transmission rates have increased from 1.25 gigabits per second (Gb/s) to 2.5 Gb/s, 10 Gb/s, and are shortly expected to reach rates of 40 Gb/s. While specialized components may be able to receive data at such increased rates, the data rate is often slowed down for processing of the data by less specialized components. A common method of reducing a data rate is to deserialize, or put in parallel, received serial data. For example, serial data transmitted at 40 gigabits per second may be deserialized into a 16 bit bus operating at 2.5 gigahertz. At 2.5 Gb/s, however, skew tolerance for process variations and other factors is often minimal.

SUMMARY OF THE INVENTION

The present invention provides parallel data de-skew systems and methods. In aspects of the present invention a sample data channel is provided in parallel to parallel data channels to allow for deskewing of the parallel data channels. The sample data channel carries sample data, which in some aspects is data sampled from data for transmission over or transmitted over the parallel data channels. In some aspects the sample data channel carries a forward data sample in the same direction of transmission as data transmitted over the parallel data channels. In some aspects the sample data channel carries a reverse data sample in the opposing direction of transmission as data transmitted over the parallel data channels. In aspects of the present invention the sample data is compared with data transmitted over the parallel data channels to allow for adjustment of skew in signal paths of data transmitted over the parallel data channels.

In one aspect of the invention a de-skew system comprises a plurality of data channels over which data is transmitted. A plurality of selectors are coupled to the plurality of data channels. A controller is coupled to the plurality of selectors and configured to cause the selectors to provide data from a desired data channel for transmission over a forward data sample channel. In a further aspect data transmitted over the forward data sample includes a header. In yet a further aspect the de-skew system comprises a processor receiving data from the plurality of data channels and the forward data sample channel. A deskew module is configured to collect portions of the received data and to adjust collection of each of the received data based on the received forward data sample and the collected portions of the received data.

In one aspect of the invention a processor is configured to receive input data and generate parallel data. A buffer unit receives the generated parallel data and a clock signal and generate a plurality of data signals based on the received generated data and clock signal. A control unit is configured to collect portions of the plurality of data signals and to generate a forward data sample based on the collected portions of the plurality of data signals.

One aspect of the invention is a de-skew method. The method includes receiving data from a plurality of data channels, selecting a portion of data from each of the received data, and generating a forward data sample comprising the selected portions of the data. A further aspect includes receiving the forward data sample, identifying the portion of the data correspond to received data from the plurality of data channels, determining a delay based on timing between the portion of data and the corresponding received data, and passing the received data along the plurality of data channels after the determined delay.

One aspect of the invention is a de-skew method comprising centering a forward data sample, comparing the forward data sample to data on one of a plurality of data channels., and determining a time variation between the data and the forward data sample.

One aspect of the invention comprises determining a channel number for a forward data sample, retrieving data from a data channel identified by the channel number, the data channel being a first data channel, comparing the data from the first data channel with a slice of delayed data from the forward data sample, and adjusting timing of the forward data sample when the data from the first data channel corresponds to the slice of the delayed data.

One aspect of the invention comprises selecting data from specific channel of a plurality of channels, centering skew adjustment for the specific channel, adjusting a forward data sample until data in the forward data sample matches the selected data, selecting another channel of the plurality of channels, adjusting skew on the selected channel until data in the selected channel matches the forward data sample, and rotating through all the plurality of channels to select and adjust skew of all the plurality of channels to match the forward data sample.

One aspect of the invention is a de-skew system. The de-skew system comprises a processor configured to receive input data and generate parallel data, a de-skew unit receiving the generated parallel data and a timing signal and adjusting timing of the generated parallel data, based on the timing signal, to generate a plurality of data signals, and a control unit configured to collect portions of the plurality of data signals and to receive a loop data sample and generating the timing signal based on a comparison of the collected portions of the plurality of data signals and the loop data sample.

One aspect of the invention comprises receiving a loop back data sample, determining a data channel specified-by the loop back data sample, determining a delay-for data from a specific channel when the determined data channel is the specific channel, and delaying data from the specific channel by the determined delay.

One aspect of the invention comprises a method of deskewing parallel data channels between a transmitting unit and a receiving unit using a forward sample channel, the transmitting unit providing data signals to the receiving unit over the parallel data channels and also providing sample signals to the receiving unit over the forward sample channel, the method comprising selecting a data channel for deskewing, transmitting data over the data channel, transmitting the data over the forward sample channel, comparing received data transmitted over the data channel with received data transmitted over the forward sample channel, and deskewing the data channel based on the comparison.

One aspect of the invention comprises providing parallel data over a plurality of parallel data lines, successively providing sample data over a sample channel, the sample data corresponding to data of the parallel data, and using the sample data to align the parallel data.

One aspect of the invention is a system including deskew functions comprising an upstream unit providing parallel data to a downstream unit over parallel data channels, a downstream unit receiving the parallel data from the upstream unit over the parallel data channels, and a sample channel coupling the upstream unit and the downstream unit, the sample channel carrying samples of the parallel data.

One aspect of the invention is a system of two units coupled by parallel data lines comprising a first unit providing parallel data over N parallel data lines, a second unit receiving the parallel data over the N parallel data lines, a spare channel in parallel with the N parallel data lines, the first unit providing data of the parallel data lines over the spare channel, the second unit receiving the data of the parallel data lines over the spare channel, a return channel in parallel with the N parallel data lines, the second unit providing data of the parallel data lines over the return channel, the first unit receiving the data of the parallel data lines over the return channel, and at least one unit in the first unit deskewing the N parallel data lines using data of the parallel data lines received over the return channel.

These and other aspects of the present invention will be more readily understood upon review of the accompanying drawings and following detailed description.

BRIEF DESCRIPTION OF THE DRAWINGS

FIG. 28 illustrates an exemplary header transmitted with a data sample; and

DETAILED DESCRIPTION

In one aspect of the present invention a sample channel is provided in parallel with a plurality of data channels. The sample channel carries copies of data carried by the data channels, and the sample channel is used to time, or synchronize or de-skew, the data channels.

In one embodiment the sample channel is provided data from the data channels at a transmitting side. A receiving side compares data transmitted on the sample channel with corresponding data transmitted on a data channel to bit, byte and/or word align successive data channels. In an alternative embodiment the sample channel is provided data from the data channels at the receiving side, and the data of the sample channel is received by the transmitting side. The transmitting side compares the data on the sample channel with corresponding delayed data from a data channel to adjust delays in transmission of the data in the data channels. In a further embodiment, a spare channel is used to provide data, from the data channels, from a transmitting side to a receiving side, and a sample channel provides data from the data channels and/or the spare channel from the receiving side to the transmitting side. The use of the spare channel allows for alignment changes of the data in the data channels without potential corruption of data intended for downstream processing.

Figure 1:
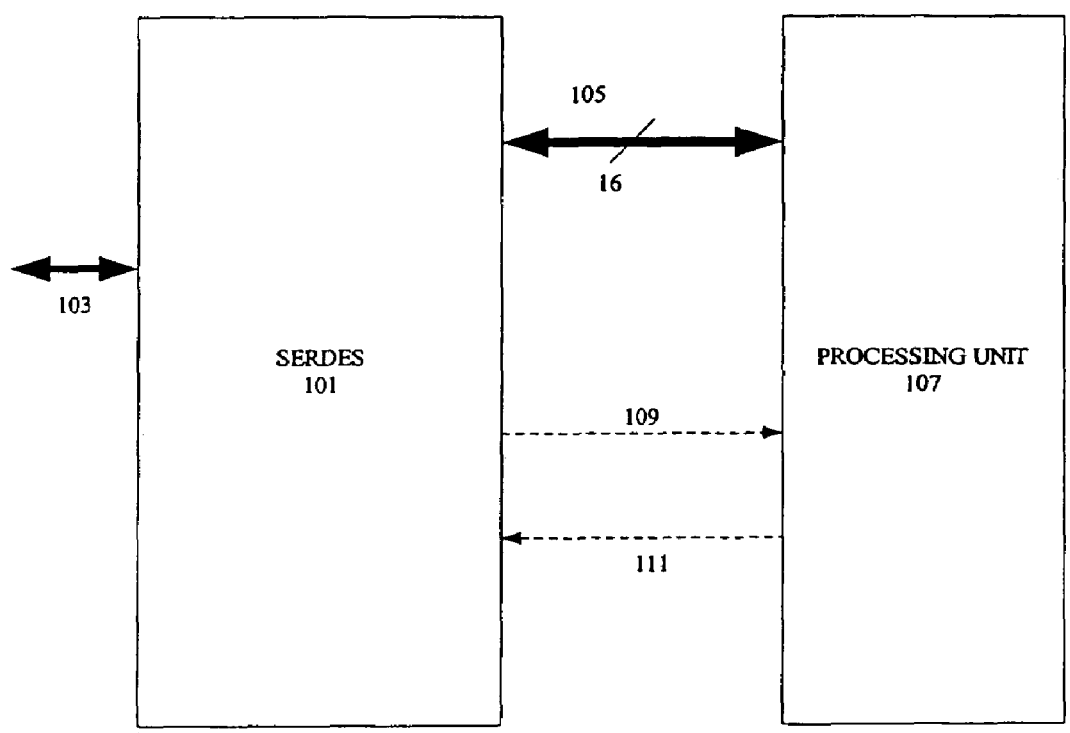
FIG. 1 is a block diagram of a de-skew system in accordance with aspects of the present invention.

FIG. 1 illustrates a system in accordance with the present invention. As illustrated, the system includes a serializer/deserializer (SERDES) 101. In alternative embodiments the SERDES is replaced by a processor or other unit, with the processor or other unit containing functions such as, for example, those hereinafter described. The SERDES receives communication data over a transmission link 103. The transmission link is often a fibre optic cable coupled to a photodiode, transimpedance amplifier, and other receiving circuitry (not shown). The SERDES deserializes the communication data and places the deserialized data on a bus 105, including an output bus. In the embodiment illustrated the output bus is a 16-bit bus. The SERDES is therefore a 1:16 deserializer, and the output bus includes 16 data channels.

The output bus is coupled to a processing unit 107. The processing unit processes the deserialized data. As the data transmitted on the output bus includes data received over a plurality of clock cycles from the transmission links, a clock cycle of the output bus is, in the embodiment described, 16 times longer than that of the transmission link. Thus, the processing unit may operate at clock speeds that are a fraction of the clock speed of the SERDES.

The processing unit in various embodiments performs a variety of functions. In one embodiment, the processing unit receives data on the output bus and arranges the data in frames. For example, when the processing unit is utilized as part of a SONET communication system, the processing unit descrambles the data as appropriate and frames the data using, for example, the A1A1A1A2A2A2 framing pattern. In other embodiments the processing unit may perform forward error correction processing or other processing.

The SERDES also receives data from the processing unit over the bus, as illustrated including an input bus. The SERDES serializes the data and provides the data over the transmission link.

Also coupling the SERDES and the processing unit is a sample channel 109. In one embodiment, the SERDES places information from different channels of the output bus onto the sample channel at predefined intervals. In another embodiment the SERDES places information from different channels of the output bus onto the sample channel in response to a command or request from the processing unit. The information provided on the sample channel allows the processing unit to adjust for transmission time variations, or skew, in the data channels.

Figure 2:
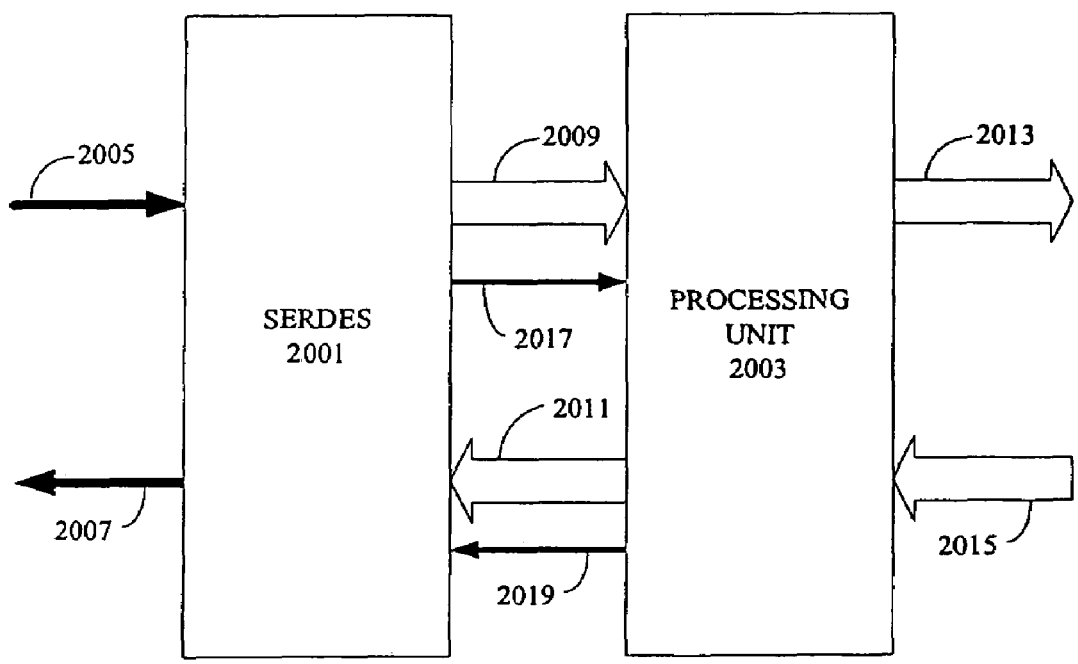
FIG. 2 is a further block diagram of a unit providing a serial/parallel interface function.

FIG. 2 illustrates a further block diagram of a unit providing a serial/parallel interface function. The unit includes a SERDES 2001 and a processing unit 2003. The SERDES is bi-directional as it performs both a serialization and deserialization function. Accordingly, the SERDES receives data from a first serial transmission line 2005 and also provides data on a second serial transmission line 2007. The SERDES receives the serial data on the first serial data line and deserializes the data to provide parallel data 2009 to the processing unit. Conversely, the SERDES receives parallel data 2011 from the processing unit and serializes the parallel data for transmission on the second serial data line. The processing unit provides parallel data 2013 to other units (not shown), as well as receives parallel data 2015 from other units.

In addition the SERDES also provides a serial sample signal 2017 to the processing unit, as well as receives a serial sample signal 2019 from the processing unit. Accordingly, the SERDES and processing unit have a parallel interface, with the parallel interface including data signals and a sample signal associated with the data signals.

Figure 3A:
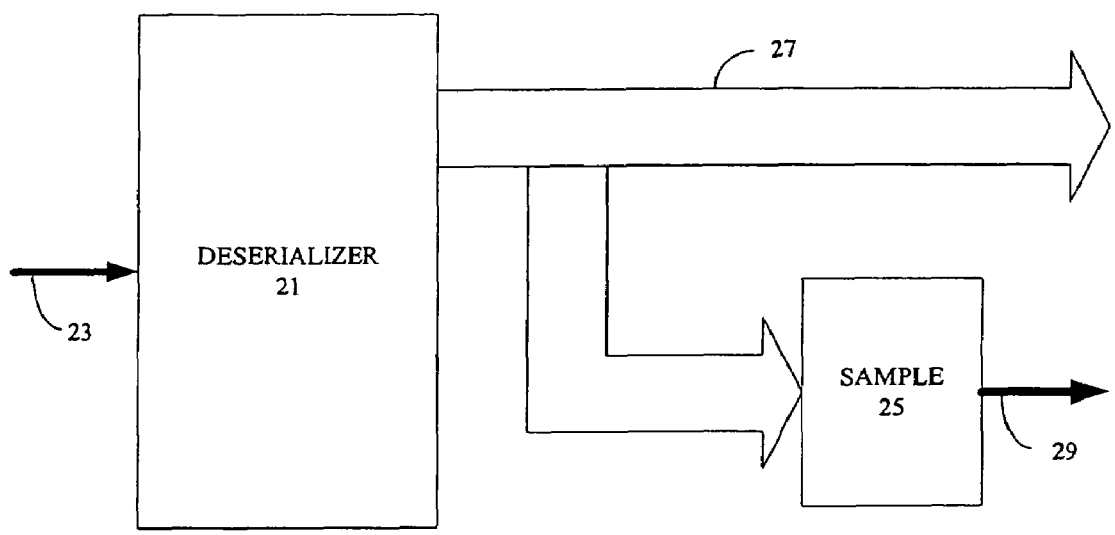
FIG. 3A is a block diagram of an upstream serializer/deserializer (SERDES) unit providing a forward data sample.

FIG. 3A illustrates a block diagram of a transmitting (up stream) side of a system using a forward data sample. As illustrated, the up stream device is a SERDES device, with the deserializer function illustrated. Accordingly, a deserializer 21 receives a serial data stream 23. The deserializer deserializes the data stream and forms a plurality of data streams 27. The data streams are provided over a parallel transmission system to another component (not shown)

The plurality of data streams are also provided to a sample unit 25. The sample unit provides a data stream 29, in part by selecting one of the data streams to the other component.

In various embodiments the sample unit selects data streams for transmission to the other component using various criteria. In one embodiment the sample unit periodically selects a particular data stream, with the data streams selected, for example, in round robin fashion. In some embodiments the selected data stream is based on a signal generated by the other component. For example, in one embodiment the other component provides a signal commanding selection of a particular data stream, and in another embodiment the other component provides a signal that serves as a start signal for selection of a particular data stream followed by periodic selection of other data streams.

Figure 3B:
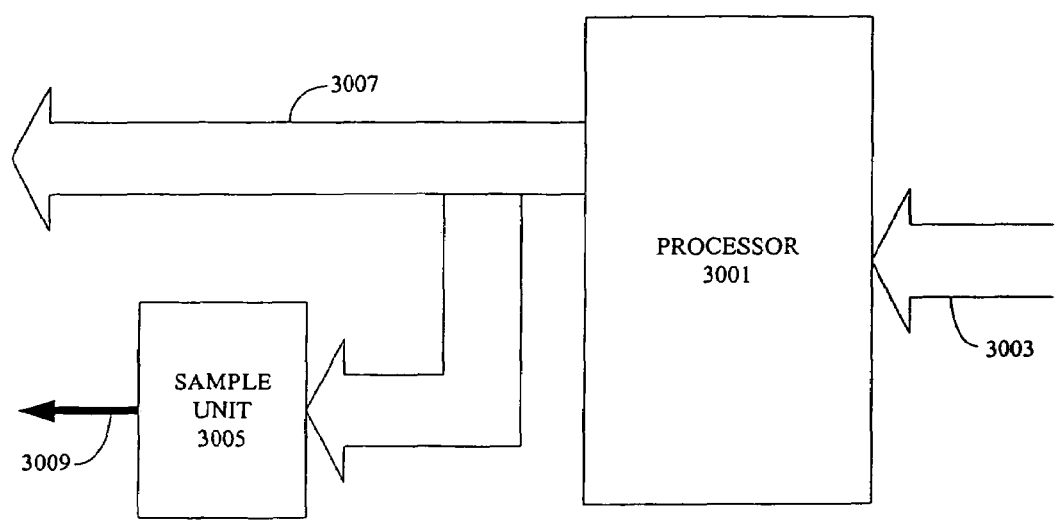
FIG. 3B is a block diagram of an upstream processing unit providing a forward data sample.

FIG. 3B is a block diagram of a portion of a processing unit providing data to a SERDES. The processing unit includes a processor 3001 which processes received parallel data 3003 and outputs parallel data 3007. The parallel data is also provided to a sample unit 3005. The sample unit selectively places data from the parallel data lines onto a sample channel 3009. In various embodiments, the processing unit may be such as a framer or FEC processor.

Figure 4:
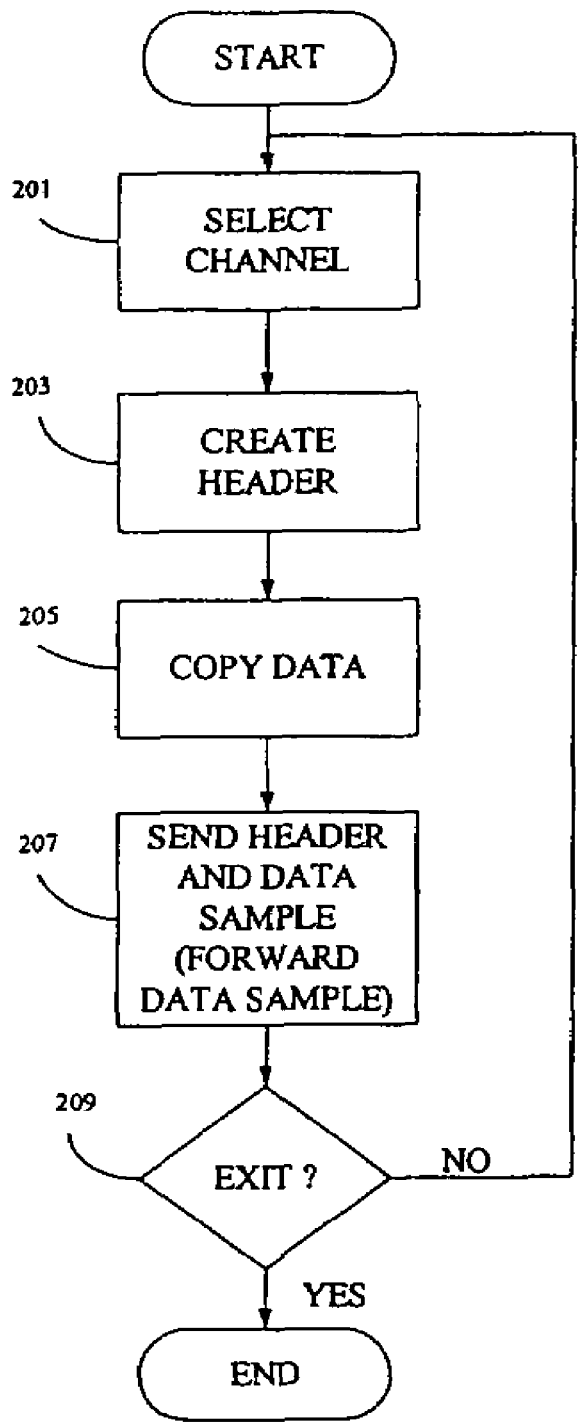
FIG. 4 is a flow diagram of a process of providing data on a sample channel.

FIG. 4 illustrates a flow diagram of a process performed by, for example, the SERDES. For example, with respect to FIGS. 3A and 3B the process is performed by the sampling unit. Those of ordinary skill in the art will recognize that generally the process of FIG. 4, and various other processes, is generally implemented in hardware, with the hardware functions described, for example, through the use of a design language such as HDL, VHDL, or the like. The design language is thereafter synthesized and otherwise processed to provide the hardware component layout.

In Block 201 of the process of FIG. 4 a channel is selected. The channel is one of, for example, 16 data channels. In Block 203 the process creates a header. The header comprises, in one embodiment, a channel number and status word. The channel number is indicative of the selected channel. The status word allows for transmission of further additional information, or other out of data channel information, from the SERDES to the processing unit.

In Block 205 the process copies data from the selected channel. The copied data is a predetermined number of bytes from the selected channel. In Block 207 the process transmits the header and copied data from the SERDES to the processing unit. The header and copied data together comprise a forward data sample. In Block 209 the process determines if an exit has been commanded. If no exit has been commanded, the process returns to Block 201 and selects a further channel for transmitting a further data sample. In one embodiment the channels are selected on a round-robin basis, although in other embodiments other selection criteria are used.

Figure 5:
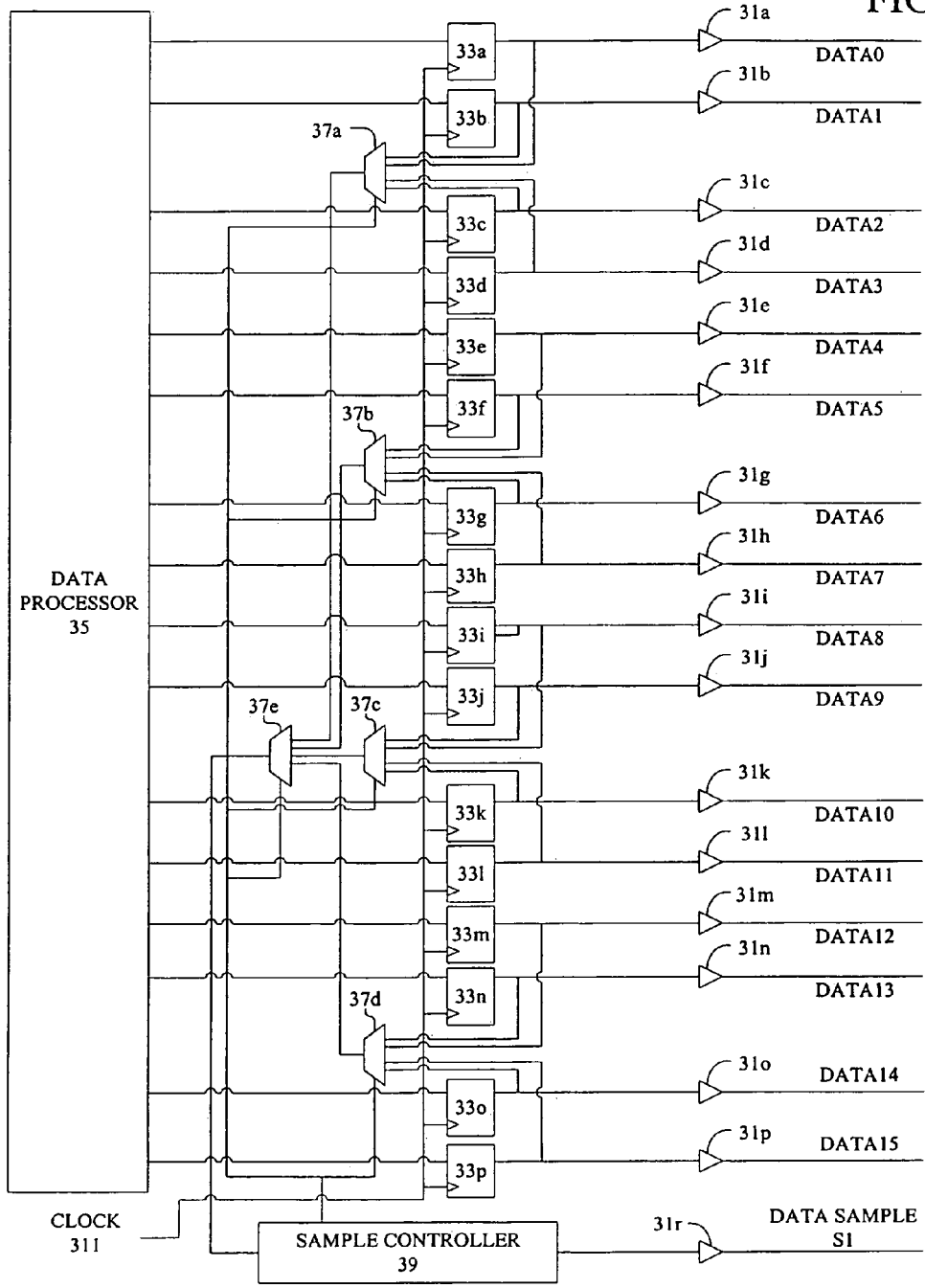
FIG. 5 illustrates a semi-schematic diagram of one embodiment of a unit providing data on a sample channel.

FIG. 5 illustrates a semi-schematic diagram of an upstream unit, such as a SERDES. The upstream unit of FIG. 5 provides 16 data channels DATA0-DATA15. The upstream unit also provides a forward data sample channel S1. The channels are driven by buffers 31a-p. In various embodiments, depending on the physical characteristics of the layout, such as whether the upstream unit and downstream unit (not shown in FIG. 5) are part of a common chip, separate modules within a module, or are separate chips, the buffers are replaced by a variety of different driving units.

The data received by each of the buffers is clocked by clock signal 311. Accordingly, as illustrated, each of the buffers receives data from a corresponding latch from latches 33a-p. Each latch receives data from a data processor 35. For a SERDES, for example, the data processor performs a deserializing function.

Each of the outputs of the latches are also provided to multiplexers. As illustrated, five 4×1 multiplexers 37a-37e are utilized to select a data sample. Accordingly, data samples DATA0-DATA3 are provided to a first multiplexer 37a, data samples DATA4-DATA7 are provided to a second multiplexer 37b, data samples DATA8-DATA11 are provided to a third multiplexer 37c, and data samples DATA12-DATA15 are provided to a fourth multiplexer 37d. The output of each of the first, second, third, and fourth multiplexers are in turn provided to a fifth multiplexer 37e, whose output is provided to a sample controller 39.

The sample controller controls the selectors of the multiplexers 37a-e so as to be able to select data from a particular data channel. The sample controller also provides data to the output buffer for the data sample. Thus, the sample controller selects a data channel, sets the appropriate selectors from the multiplexers, receives the output of the fifth multiplexer, and appends the data from the data channel to the header to form a forward data sample S1. The sample controller provides the forward data sample to the buffer 31r for transmission to a processing unit (not shown).

Figure 6:
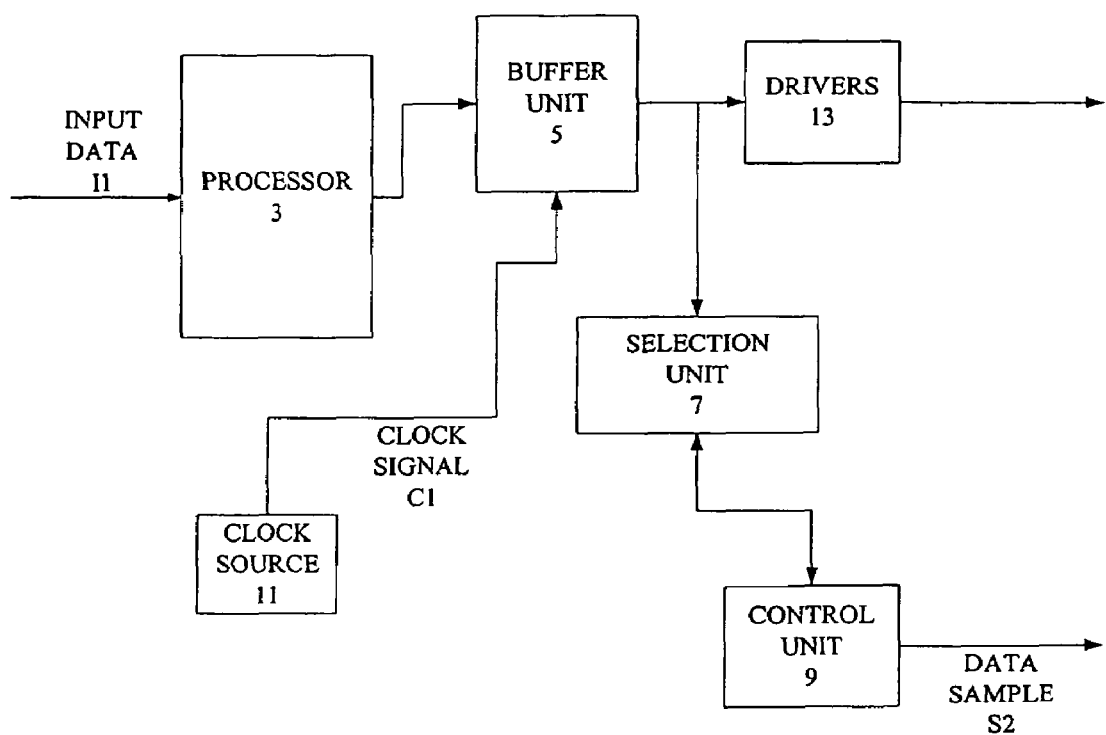
FIG. 6 illustrates a block diagram of one embodiment of a unit providing data on a sample channel.

FIG. 6 illustrates a block diagram of a further embodiment of a system which is configured to perform the process of FIG. 4. In FIG. 6, a processor 3 receives input data I1. The input data, in one embodiment, is information provided via an optical link. The processor de-serializes the data and supplies the data, in parallel form, to a buffer unit 5. In another embodiment the processor receives parallel data, processes the parallel data, and provides parallel data to the buffer unit. A clock source 11 also supplies a clock signal C1 to the buffer unit 5. Based on the clock signal, the buffer unit forwards data to drivers 13. The drivers transmit the data to, in one embodiment, another processing unit (not shown).

The buffer unit also forwards data to a selection unit 7. A control unit 9 is coupled to the selection unit and commands the selection unit to generate or select specific samples or portions of data received from the buffer unit. In one embodiment, the data selection is performed in a round-robin fashion. The control unit aggregates the samples of data to form a data sample signal S2. The control unit transmits the data sample signal to, in one embodiment, another processing unit (not shown).

Figure 7:
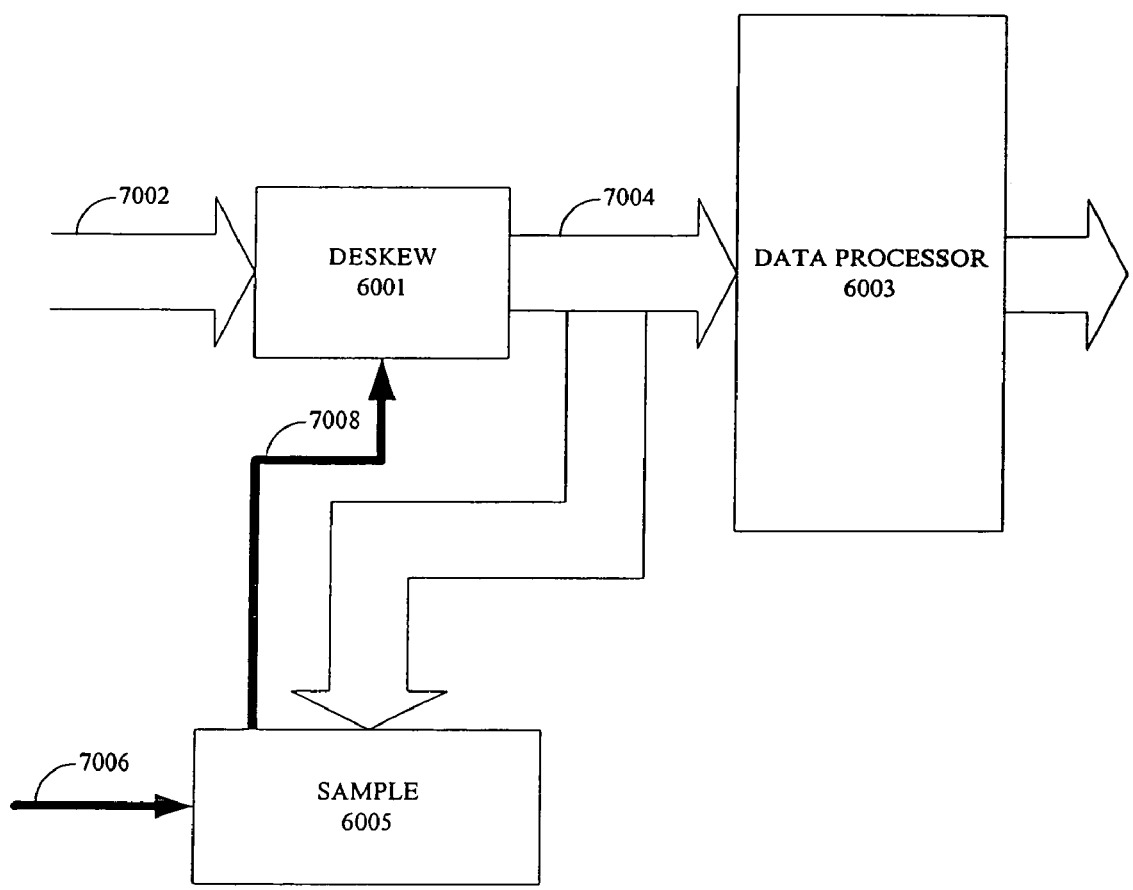
FIG. 7 is a block diagram of a downstream processing unit providing a deskew function using data from a sample channel.

The processing unit uses the forward data sample to de-skew the data channels. FIG. 7 illustrates a block diagram of one embodiment of the processing unit. The processing unit is provided data on parallel data lines 7002. The parallel data lines are provided to de-skew circuitry 6001. The de-skew circuitry delays each channel that make up the parallel data lines. The delays are adjustable on a per data channel basis, and as such, the de-skew circuitry provides de-skewed data 7004. The de-skewed data is provided to a data processor 6003. The data processor processes the data and provides the data to other units (not shown). The de-skewed data is also provided to a sample unit 6005. The sample unit also receives a sample channel 7006. The sample channel, in one embodiment, carries data corresponding to a selected parallel data line, with the selection of the parallel data line varying over time. The sample unit compares data on the sample channel with a corresponding de-skewed data channel. Based on the results of the comparison, the sample unit provides an adjustment signal 7008 to the de-skew circuitry. The adjustment signal informs the de-skew circuitry of the appropriate delay for a particular data channel.

Figure 8:
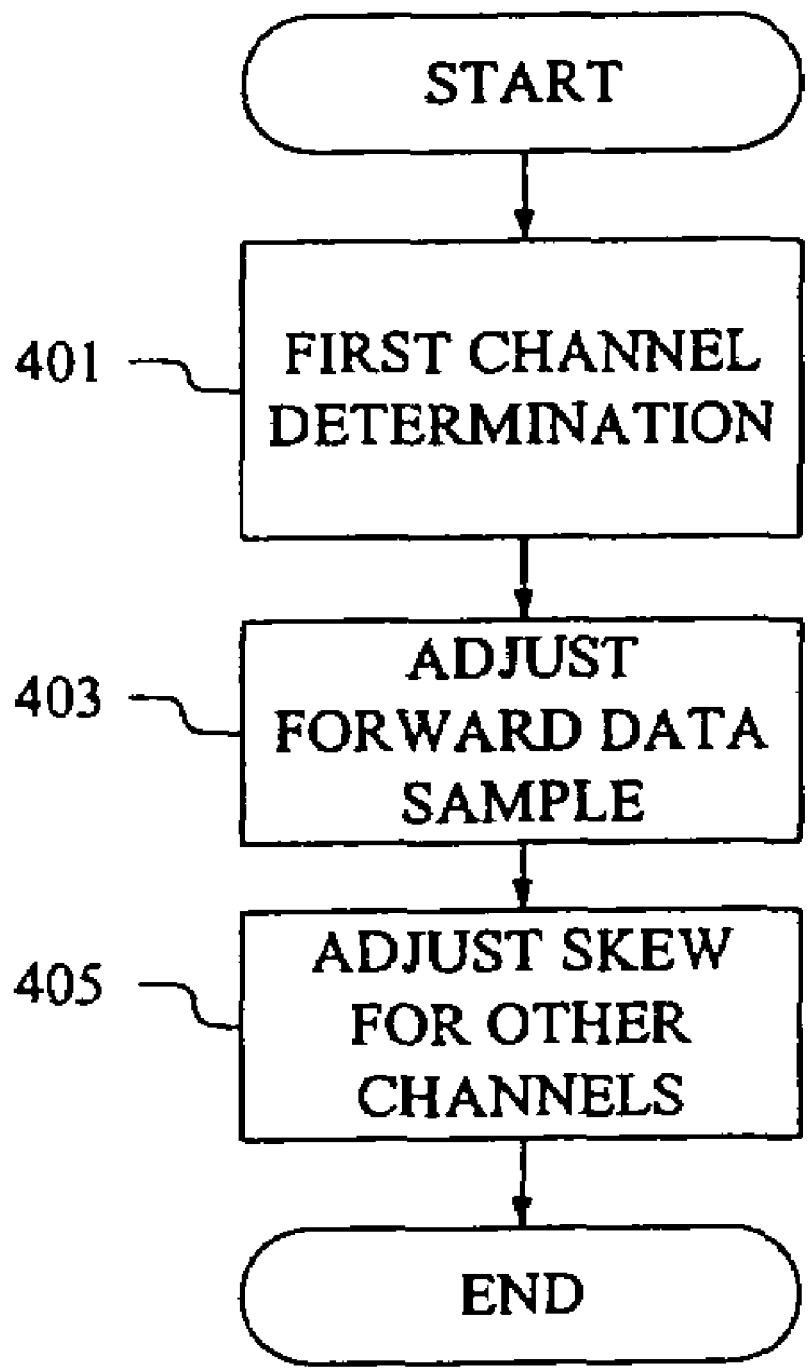
FIG. 8 illustrates a flow diagram of a process implemented by a downstream unit to de-skew data channels.

A flow diagram of a process implemented by the processing unit to de-skew the data channels is illustrated in FIG. 8. In Block 401 the process sets a sampling point for the first data channel. In Block 403 the process selects the forward data sample from the first data channel, and sets a delay for the sample channel such that the sample data in the forward sample data matches that of the first data channel. In Block 405 the process selects a sample point for each of the remaining channels such that data in each of the channels matches corresponding delayed sample data from the sample channel for each of the channels. Thus, all of the data channels are set to sampling points such that all of the data channels are aligned to the first data channel.

In alternative embodiments the delay, for the sample channel, is centered, and then the skew for each of the data channels is adjusted to match the delay of the sample channel. This has an advantage of not using different processing for different data channels, or for the first data channel, for skew adjustment.

Figure 9:
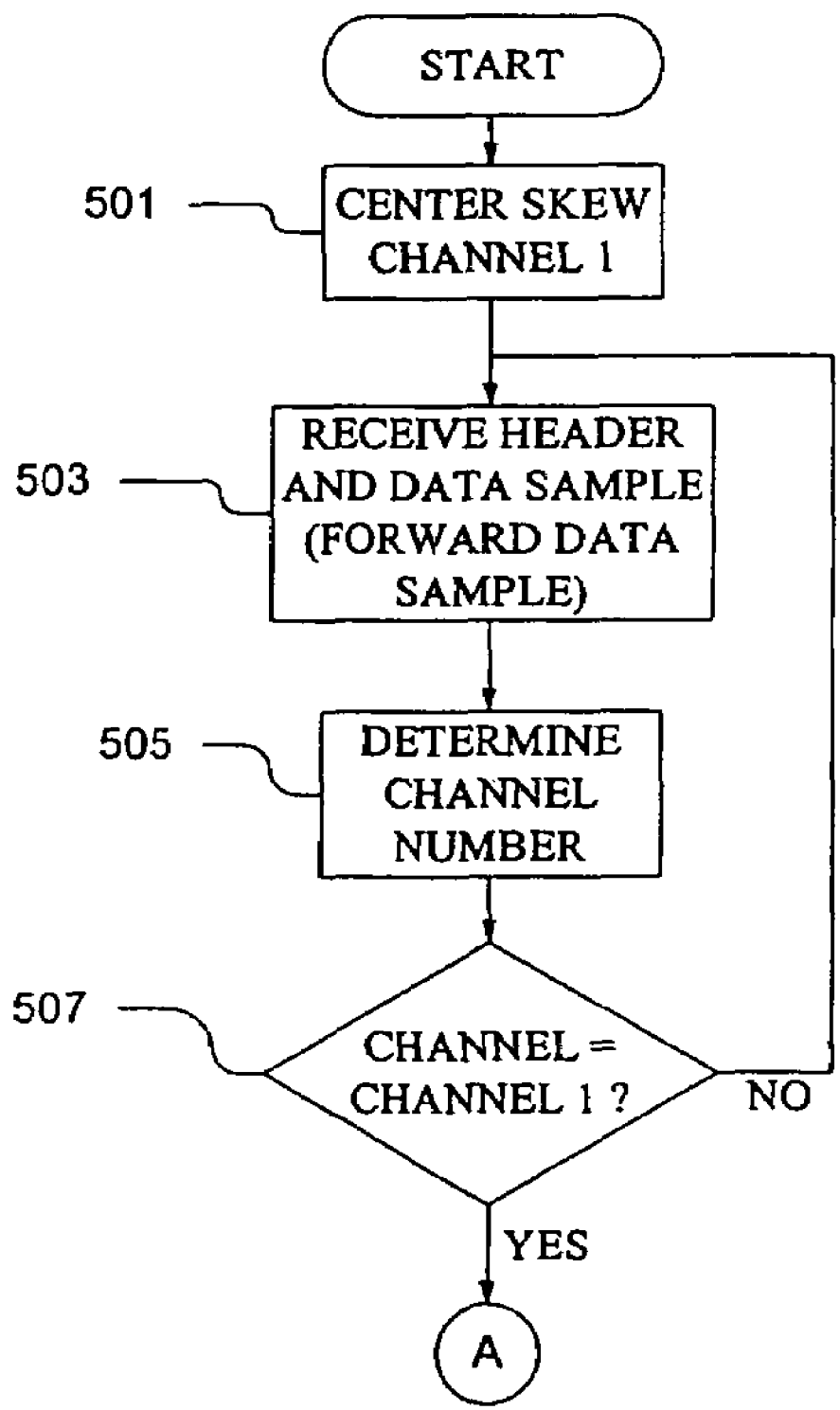
FIG. 9 is a flow diagram of a subprocess for setting a sampling point for a first data channel.

FIG. 9 illustrates a flow diagram of one embodiment of a subprocess for setting a sampling point of a first data channel for skew adjustment. In Block 501 the process sets a de-skew circuit to sample the first data channel at the midpoint of the de-skew range of the de-skew circuit. In one embodiment the actual sampling point is not necessarily at the exact midpoint of the de-skew range, but is adjusted so as to sample the first data channel approximate a center of a data eye near the midpoint of the de-skew range.

In Block 503 the process receives a forward data sample. In Block 505 the process determines the channel number specified by the forward data sample. If the process in Block 507 determines that the channel number does not correspond to the first data channel the process returns to Block 503, otherwise the process returns.

Figure 10:
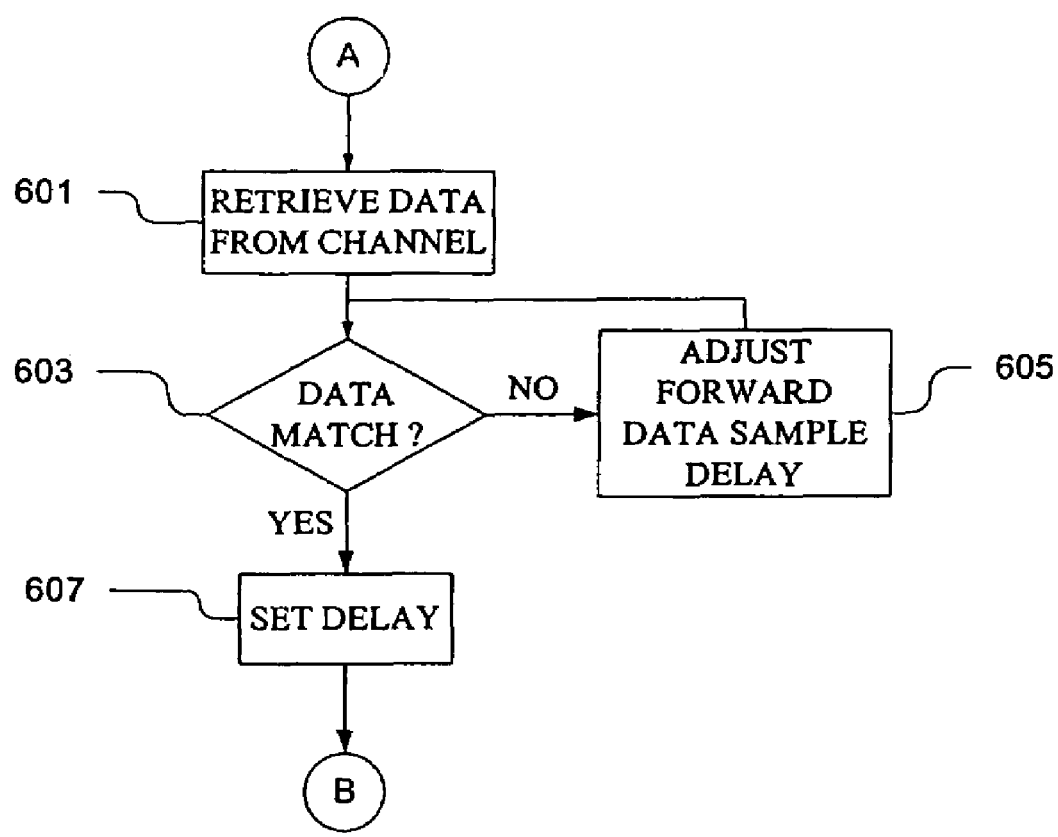
FIG. 10 is a flow diagram of a subprocess for adjusting a forward data sample delay.

Upon return the process continues to Block 403 and adjusts the forward data sample delay. A flow diagram of one embodiment of a subprocess for adjusting a forward data sample delay is illustrated in FIG. 10. In Block 601, the process retrieves data from the first data channel. In Block 603 the process compares the data from the first data channel with a slice of delayed data from the sample channel. If data does not match, the process selects another slice of delayed data from the sample channel in Block 605, and returns to Block 603. If the data matches the process sets the delay of the sample channel to match the slice in Block 607 and returns.

Figure 11:
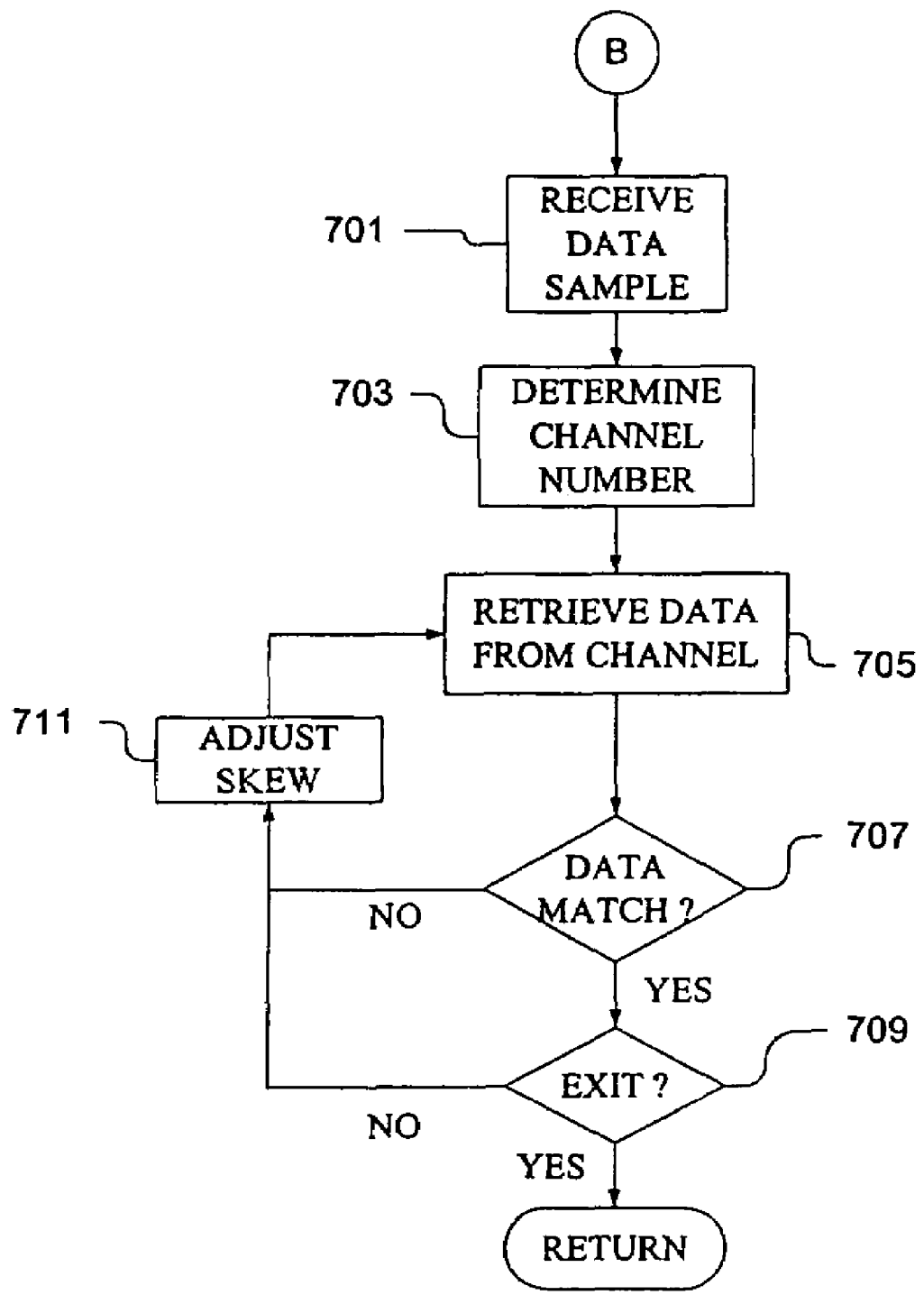
FIG. 11 is a flow diagram of a subprocess for adjusting the skew of data channels.

Once the delay of the sample channel is set the process returns to Block 405 of the process of FIG. 8 and adjusts the skew for the remaining data channels. FIG. 11 illustrates a flow diagram of one embodiment of a subprocess for adjusting the skew for the remaining data channels. In Block 701 the process receives a forward data sample. In Block 703 the process determines the channel number identified in the forward data sample. In Block 705 the process retrieves data from the data channel corresponding to the channel number. In Block 707 the process compares the retrieved data with delayed data from the forward data sample. If the data does not match then the process adjusts the sampling point of the data channel in block 711. In one embodiment the process receives a string of data from the data channel significantly greater in length than the data contained in the data sample, and compares slices of the string of data to determine the appropriate sample point to match the sample data.

In one embodiment, and as illustrated in FIG. 11, the data channel is not thereafter examined until a further forward data sample for that data channel is received. If the data matches the skew of the data channel appropriately, and the process determines that all channels have been appropriately adjusted in Block 709, the process returns. Otherwise the process continues adjusting the sampling point for additional data channels in block 711.

Figure 12:
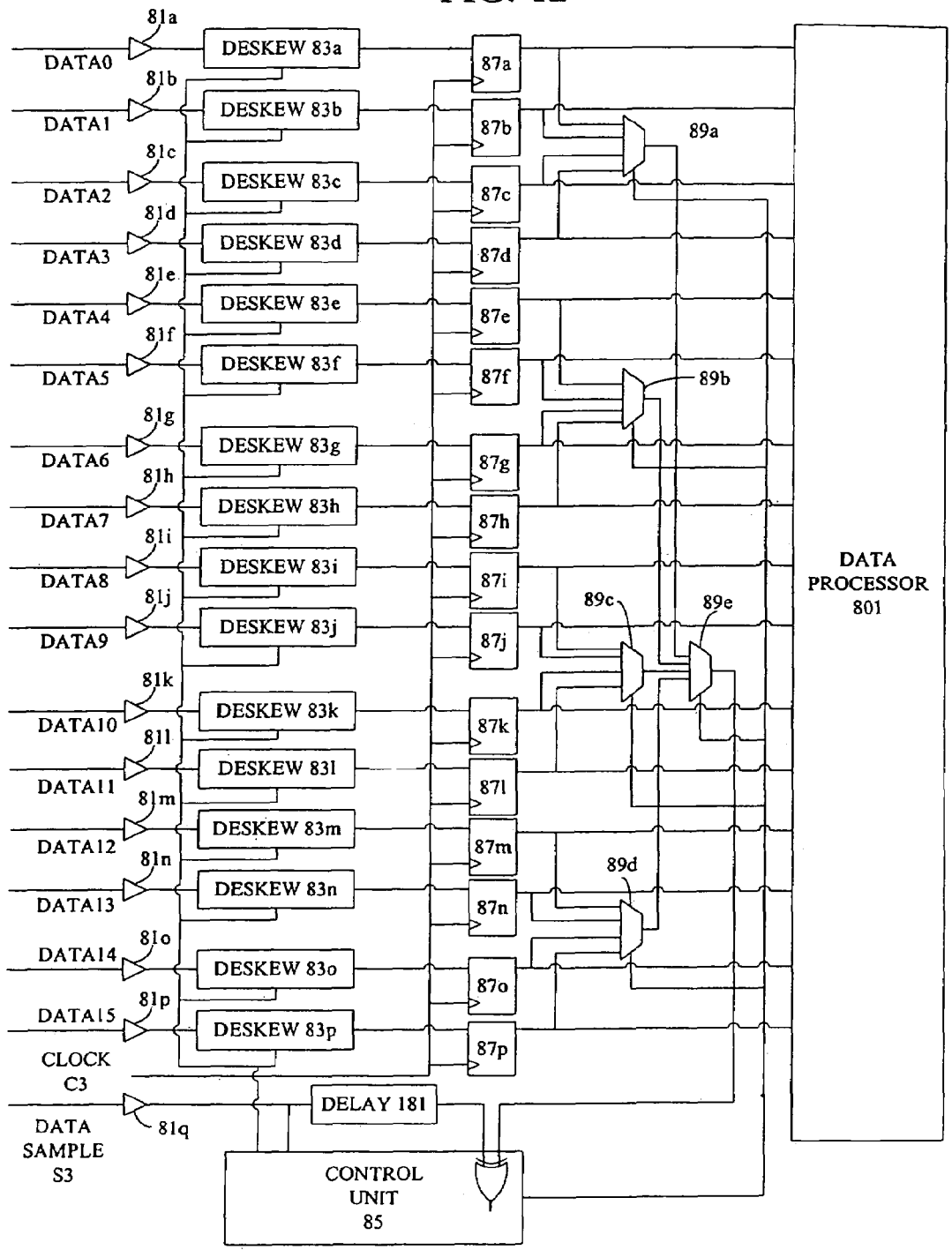
FIG. 12 is a semi-schematic diagram of one embodiment of a processing unit providing a deskew function using data from a sample channel.

FIG. 12 illustrates a semi-schematic diagram of one embodiment of a downstream unit. As illustrated the downstream unit is a processing unit which receives 16 data channels DATA0-DATA15. The processing unit also receives a sample channel S3. Each of the channels is provided to a buffer 81*a-q*. The buffers receiving data channel signals provide the signals to de-skew units 83*a-p*. In one embodiment, the de-skew units provide both coarse and fine adjustment, and the de-skew units are, each individually, under the control of de-skew control unit 85. In another embodiment, fine control of the de-skew units is provided within the de-skew units to allow the de-skew units to select sampling points approximate the center of a data eye while the de-skew control determines coarse control as to which bits begin a sequence of data. In other words, in such an embodiment the de-skew unit provides bit alignment, while the de-skew control determines byte, word, or other alignment. Thus, in alternative embodiments the de-skew unit includes a clock and data recovery unit, with one embodiment performing the clock and data recovery function by comparing results at different sample points within the data eye with results from the sample channel.

The output of each de-skew unit is provided to a corresponding latch of latches 87*a-p*. The latches are clocked by a clock signal C3. The outputs of the latches are provided to a processor and to one of several multiplexers. The processor 801 performs, for example, descrambling and SONET framing.

As illustrated, the processing unit also includes five 4×1 multiplexers 89*a-e*. Data samples DATA0-DATA3 are provided to a first multiplexer 89*a*, data samples DATA4-DATA7 are provided to a second multiplexer 89*b*, data samples DATA8-DATA11 are provided to a third multiplexer 89*c*, and data samples DATA12-DATA15 are provided to a fourth multiplexer 89*d*. The output of each of the first, second, third, and fourth multiplexers are in turn provided to a fifth multiplexer 89*e*, whose output is provided to the de-skew control unit. The de-skew control unit controls the selector of the multiplexers so as to be able to select data from a particular data channel.

A delay element 181 is also under the control of the de-skew control unit. In one embodiment the delay element is a tapped buffer, with the taps allowing selection of a delay period of the delay element. The output of the delay element is provided to the de-skew control, which allows the de-skew control to compare data from the delay element with data from the data channels.

Figure 13:
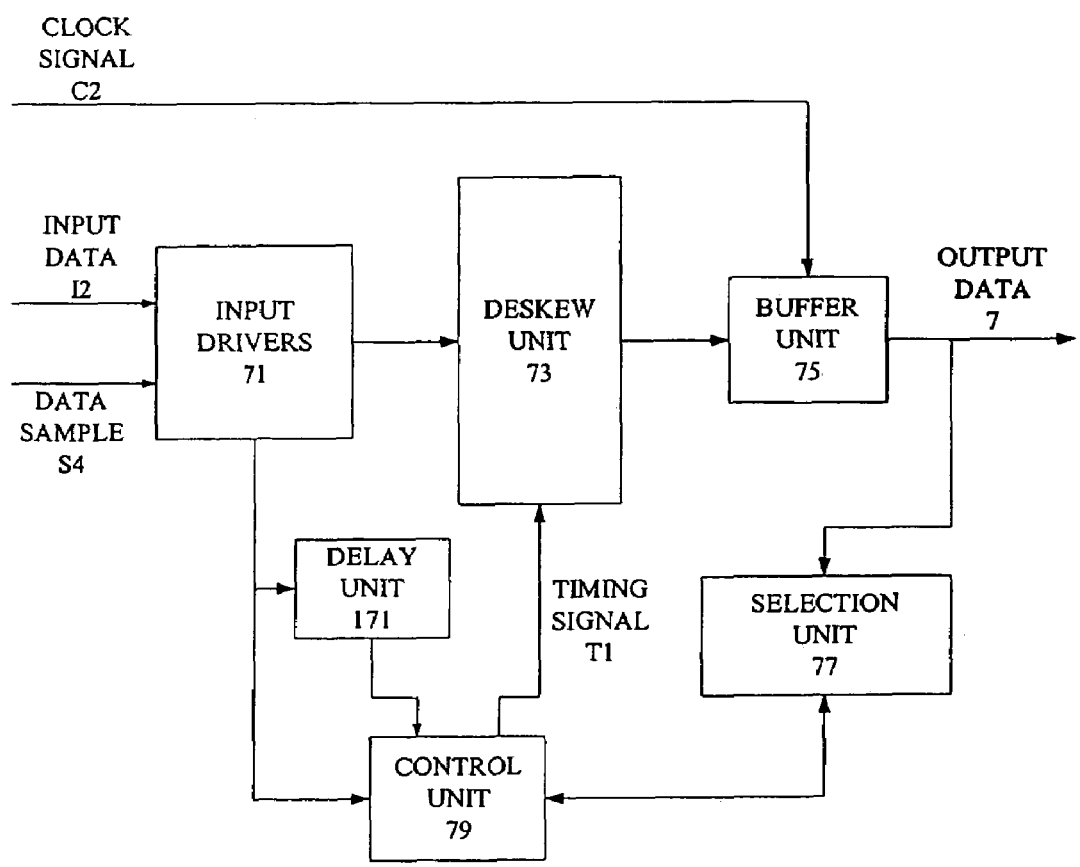
FIG. 13 is a block diagram of one embodiment of a processing unit providing a deskew function using data from a sample channel.

FIG. 13 illustrates a further block diagram of one embodiment of a processing unit. In FIG. 13, input drivers 71 receive input data I2 and a data sample S4. The input data and data sample, in one embodiment, is information provided from a SERDES (not shown). The input data is in parallel form and, in one embodiment, includes sixteen data channels. The data sample is an aggregation of portions of data. The input drivers supplies the parallel data to a deskew unit 73 and the data sample to a control unit 79. The data sample is also supplied to a delay unit 171. The delay unit is a configurable unit which is able to adjust the timing of the data sample. In one embodiment, the control unit configures the timing delay of the delay unit. The delayed sample data from the delay unit is supplied to the control unit.

The deskew unit supplies the data, in parallel form, to a buffer unit 75. A clock signal C2 is also supplied to the buffer unit 75. Based on the clock signal, the buffer unit transmits the data to, in one embodiment, another processing unit (not shown).

The buffer unit also forwards data to a selection unit 77. The control unit is coupled to the selection unit and commands the selection unit to generate or select specific samples or portions of data received from the buffer unit. In one embodiment, the data selection is performed in a round-robin fashion. The control unit aggregates the samples of data to form a second data sample signal. The control unit compares the second data sample signal to the delayed data sample and/or the data sample signal from the input drivers. Based on the comparison of the signals, the control unit determines a timing signal T1. The timing signal is supplied to the deskew unit to adjust the timing of the data supplied to the buffer unit. In one embodiment, the deskew unit delays some or all of the parallel data to the buffer by a specific delay as indicated by the timing signal.

Thus, for example, the SERDES of FIG. 5 and the processing unit of FIG. 12 are able to de-skew parallel data channels, and to do so without the use of training patterns or the like being transmitted in the data channel, although in some embodiments it is convenient to use such patterns to further data channel de-skew. In one embodiment, for example, pre-emphasis adjustment to the outgoing waveform is adjusted by SERDES, i.e., a downstream unit, to increase the ability of the processing unit to read transmitted data. In a further embodiment a control signal from the processing unit to the SERDES provides information to the SERDES for use in waveform shaping. In some embodiments the information provides information regarding the nature or characteristics of the processing unit, and in other embodiments the information provides commands as to waveform adjustment. In addition, in further embodiments the system continues operation once de-skew is complete in order to monitor alignment of the data in the data channels, and to recommence de-skew operations when data is out of alignment. Further, in various embodiments the sample channel is also used to provide information on the status of the interface or other out of channel information.

In an alternative embodiment the transmitting, or upstream, device adjusts the transmit time of the data channels to perform de-skewing. Thus, the receiving, or downstream device, provides a loop back data sample on a sample channel to the transmitting device. Accordingly, as illustrated in FIG. 1, a loop back sample channel 111 couples the SERDES and the processing unit. The processing unit is the downstream unit for present purposes. In alternative embodiments, and as implied by the SERDES, the SERDES and the processing unit are bidirectional, and each is both the downstream unit and the upstream unit, as would be understood by those of ordinary skill in the art.

Figure 14:
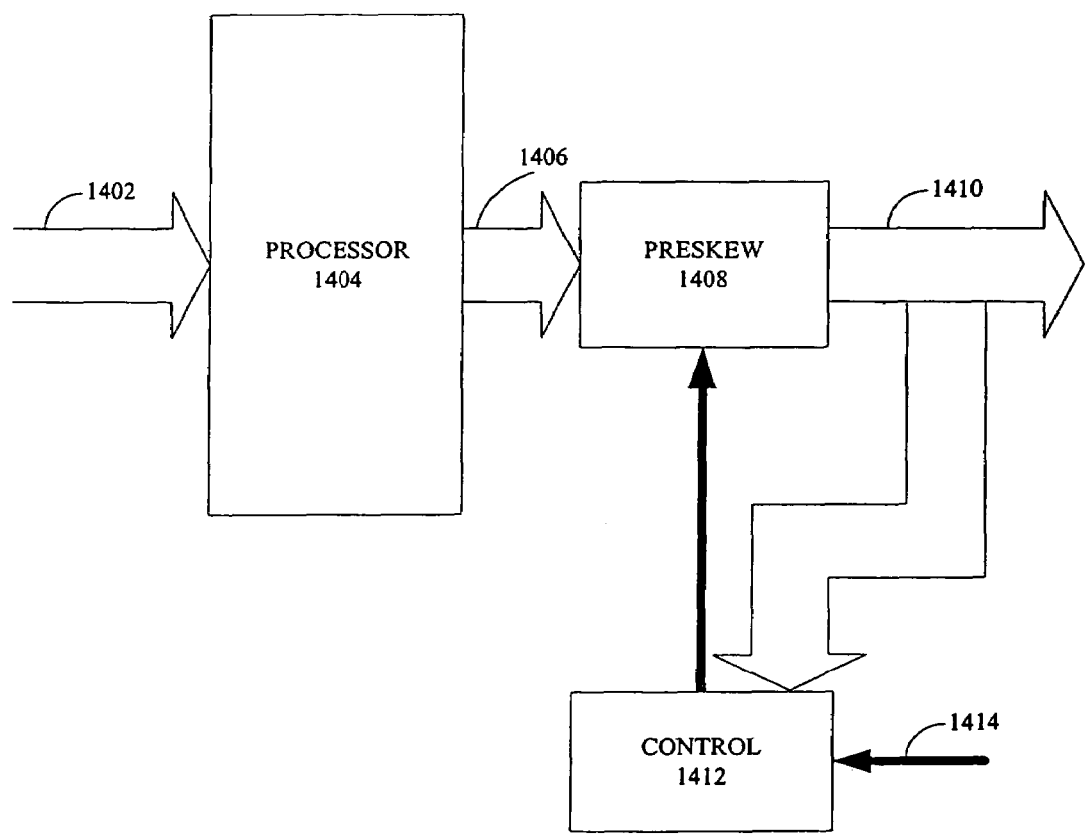
FIG. 14 is a block diagram of an upstream unit performing a preskew function using data from a sample channel.
Figure 14A:
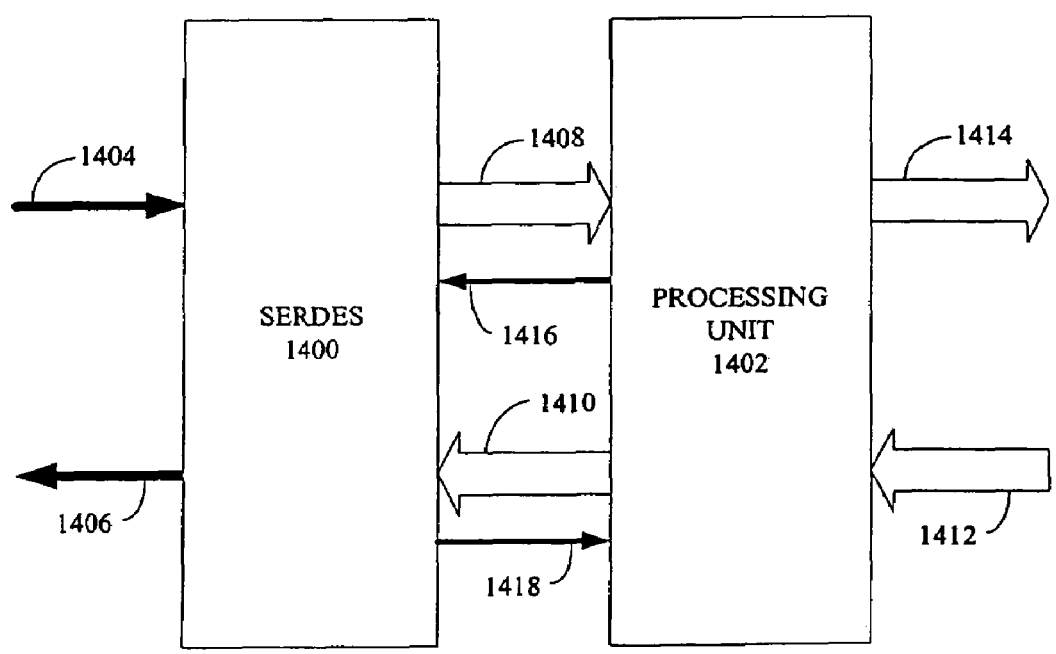
FIG. 14A is a block diagram of a system using reverse data sample channels.

FIG. 14A further illustrates a further block diagram of a system with a SERDES 1400 and a processing unit 1402. The SERDES receives serial data via first transmission connection 1404 and supplies serial data via a second transmission connection 1406. The received serial data is de-serialized and provided as parallel data via a first parallel transmission connection 1408 to the processing unit. A sample or samples of the received parallel data, e.g., a loop back data sample 1416, is generated and provided back to the SERDES. Based on the received loop back data sample, the SERDES adjusts the timing of the parallel data transmitted to the processing unit.

The processing unit also supplies the SERDES with parallel data via a second parallel transmission connection 1410. The SERDES serializes the received parallel data and transmits the data via the second transmission connection. The SERDES, in one embodiment, also generates and supplies a sample or samples of the received parallel data, e.g., a loop back data sample 1418, back to the processing unit. Based on the received loop back data sample, the processing unit adjusts the timing of the parallel data transmitted to the SERDES. Additionally, the processing unit receives parallel data and sends parallel data to other units (not shown) via a third and fourth transmission connection 1412 and 1414.

FIG. 14 illustrates a block diagram of an upstream unit in accordance with aspects of the present invention. In FIG. 14, a serial data stream 1402 is provided to a processor 1404. The processor in this case may perform a deserialization function, or other functions, and provides a parallel data stream 1406. The parallel data stream is provided to a pre-skew unit 1408. The pre-skew unit delays each of the data streams making up the parallel data stream on a data stream by data stream basis. The pre-skew unit provides a parallel output data stream 1410, which is provided to downstream units The parallel output data stream is also provided to a control 1412. The control also receives a serial sample channel data stream 1414. The serial sample channel data stream is provided, for example, from a downstream receiving unit. The serial sample data channel stream includes data selected from the parallel output data stream. On a varying basis, at any particular moment the serial sample channel data stream contains data from a particular one of the parallel output data streams. The control provides a signal to a pre-skew unit which indicates on a channel by channel basis the appropriate delay per channel.

In operation, the control compares the data in the serial sample channel data stream with corresponding data in the parallel output data stream in order to set a pre-skew delay for that particular data stream in the parallel output data stream. In one embodiment the control includes delay elements so as to delay the data stream from the parallel output data stream to allow for comparison with corresponding data from the serial sample channel data stream, which is a looped back signal from the other unit. In another embodiment the parallel output data stream is provided a repeating pattern which allows for the determination of the delay.

Figure 15:
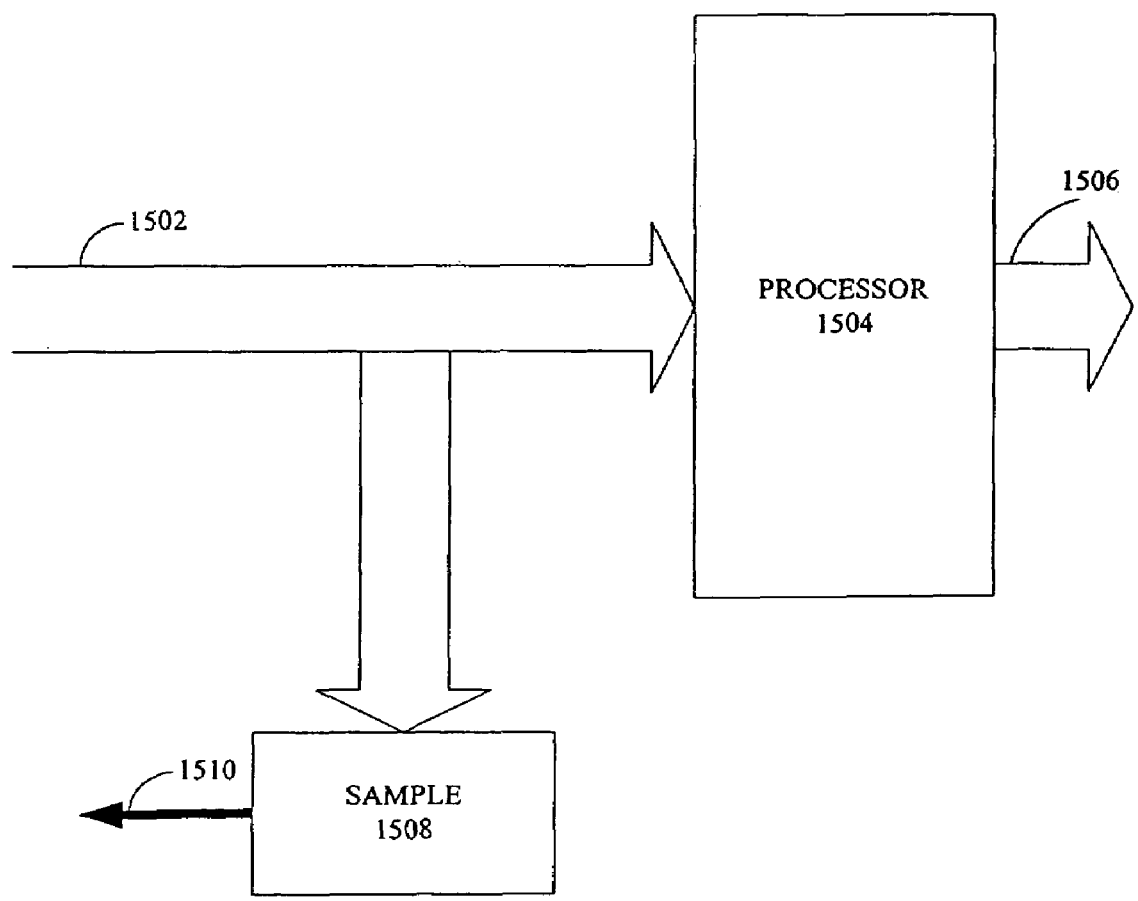
FIG. 15 is a block diagram of a downstream unit providing data on a sample channel.

FIG. 15 illustrates a downstream unit in accordance with the aspects of the present invention. The downstream unit receives a parallel data stream 1502. The parallel data stream is provided to a processor 1504 which processes the data and provides a further output data stream 1506. The processor, for example, may perform a framing function in one embodiment or a forward error correction function in another embodiment. The parallel data stream is also provided to a sample unit 1508. The sample unit selects one of the data channels forming the parallel data stream and provides the data in the selected data channel to the originating unit in a sample channel 1510.

Figure 16:
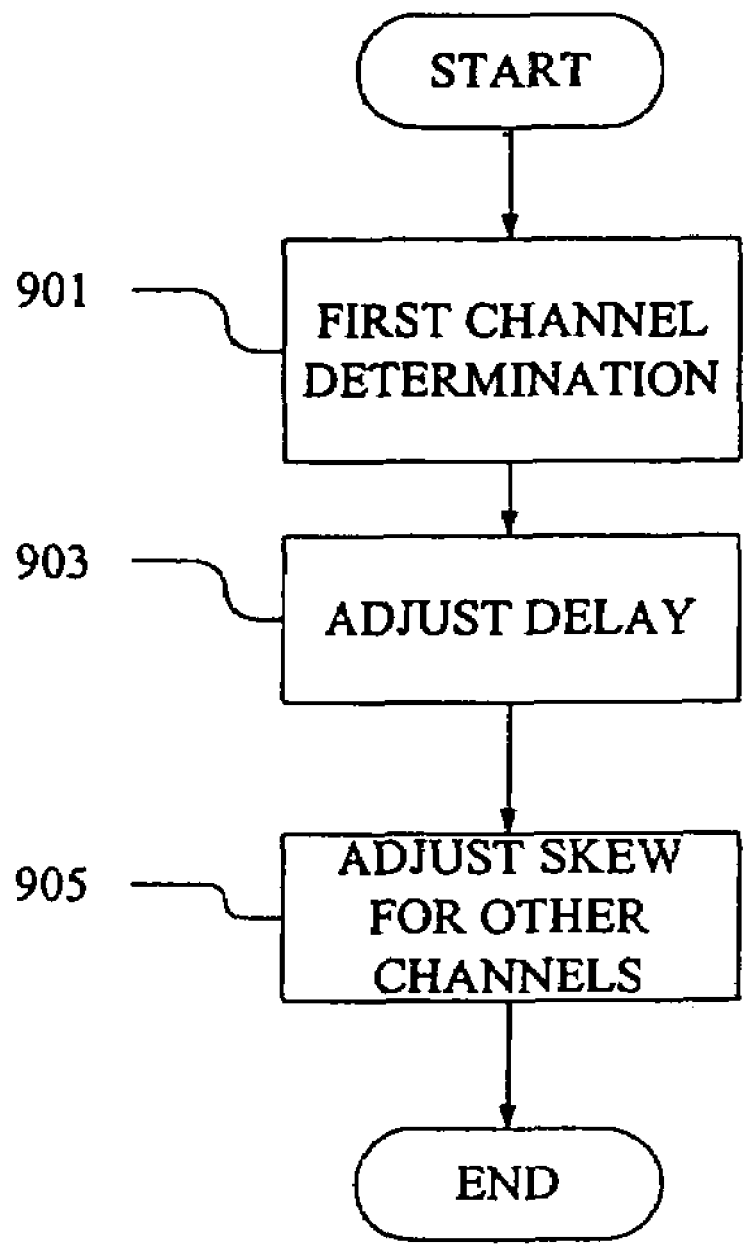
FIG. 16 is a flow diagram of a process performing a de-skew operation with a loopback data sample.

The upstream unit performs a process such as illustrated in the flow diagram of FIG. 16. In the process of FIG. 16 a first data channel is set to a transmit point in Block 901 and corresponding loop back data is located. In Block 903 a delay for the first data channel is determined so as to match the loop back data. In Block 905 the transmit point of each of the remaining channels is set so as to match data delayed by the delay with the loop back data for each channel.

Figure 17:
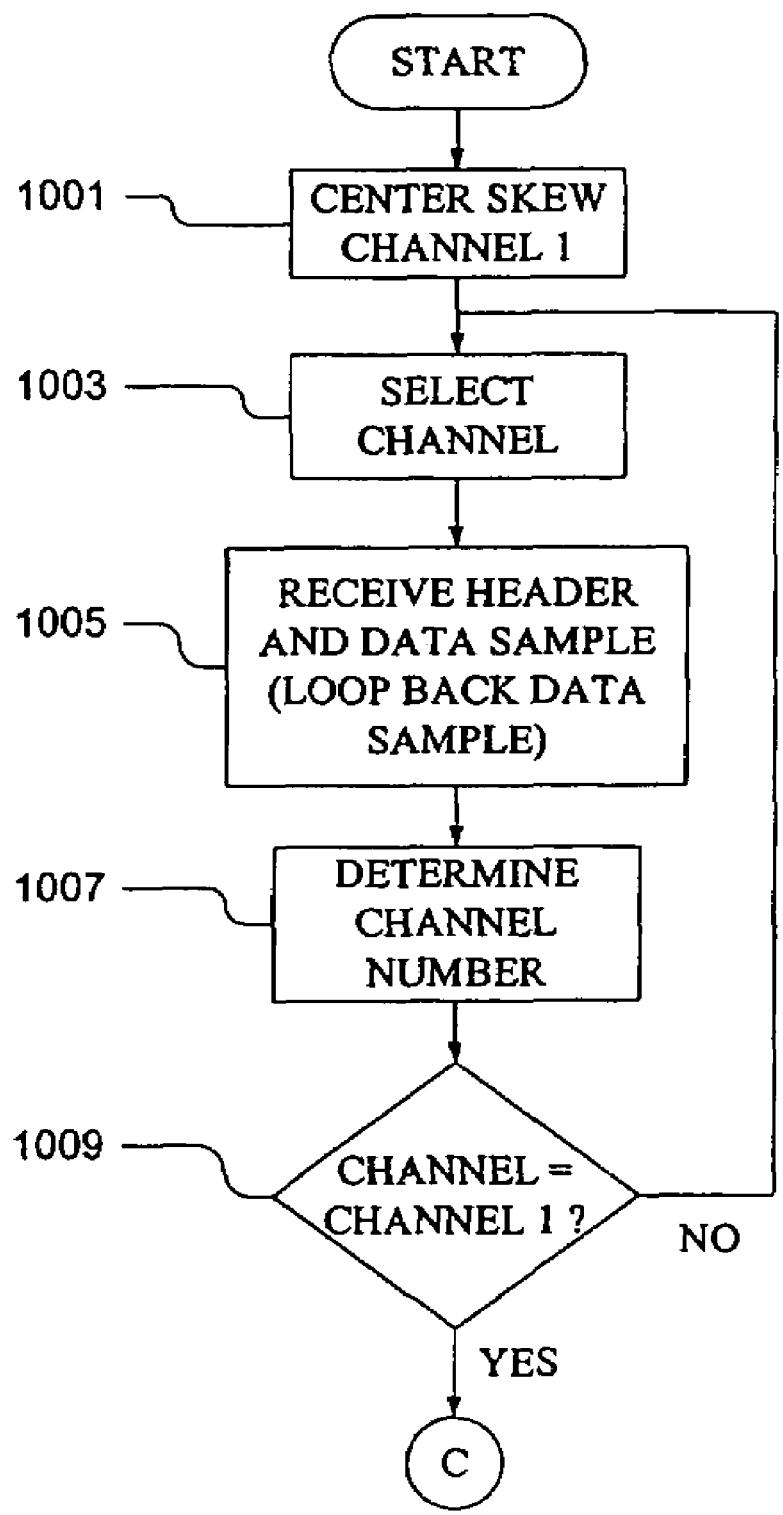
FIG. 17 is a flow diagram of a subprocess for setting the transmit point of a first channel and locating the corresponding loopback data.

A flow diagram of a subprocess for setting the transmit point of the first data channel and locating the corresponding loop back data is illustrated in FIG. 17. In Block 1001, a de-skew circuit for the first data channel is set at its midpoint. In Block 1003 data from the first channel is selected to be provided to a delay element. In Block 1005 the process receives a loop back data sample on a loop back channel. In Block 1007 the process determines the corresponding data channel identified by the loop back data sample. In Block 1009 the process determines if the corresponding data channel for the loop back data sample is the first data channel. If the corresponding data channel is not the first data channel the process returns to Block 1003. Otherwise the process returns.

Figure 18:
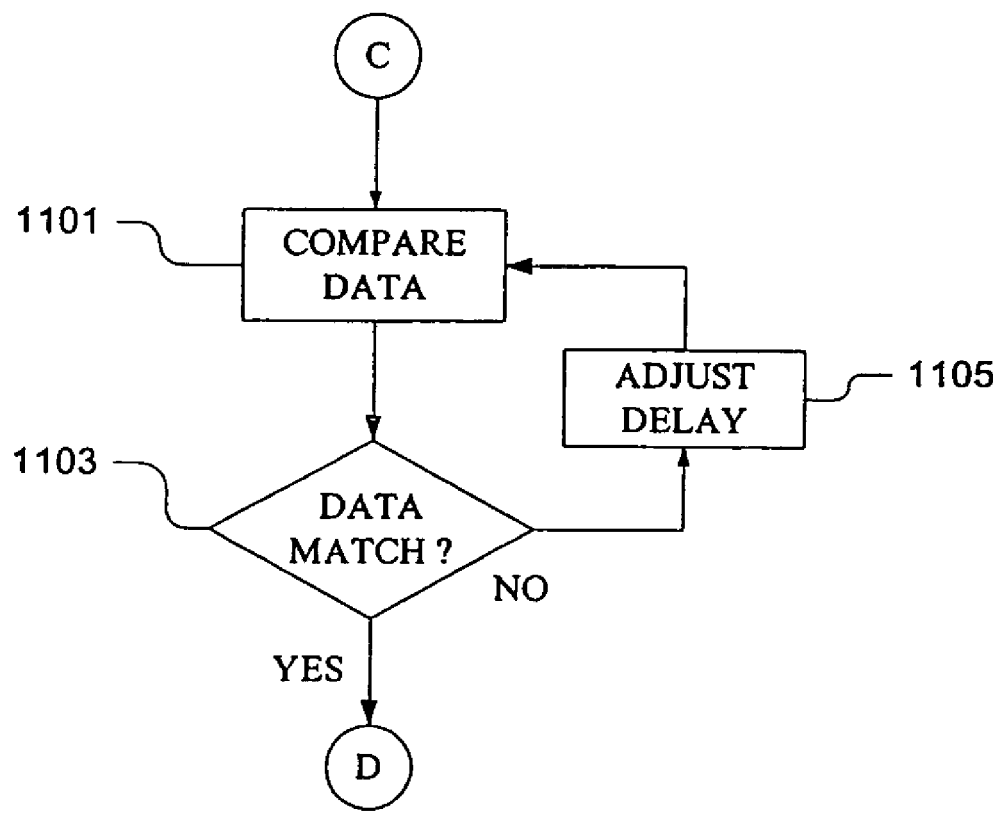
FIG. 18 is a flow diagram of a subprocess for determining a delay for the data channel data.

FIG. 18 illustrates a flow diagram of a subprocess for determining a delay for the data channel data. In Block 1101 the process compares data from the delay element with the data from the loop back data sample. In Block 1103 the process determines if the data matches. If the data does not match, the process adjusts the delay time of the delay element in Block 1105 and returns to Block 1101. If the data matches, the process returns.

Figure 19:
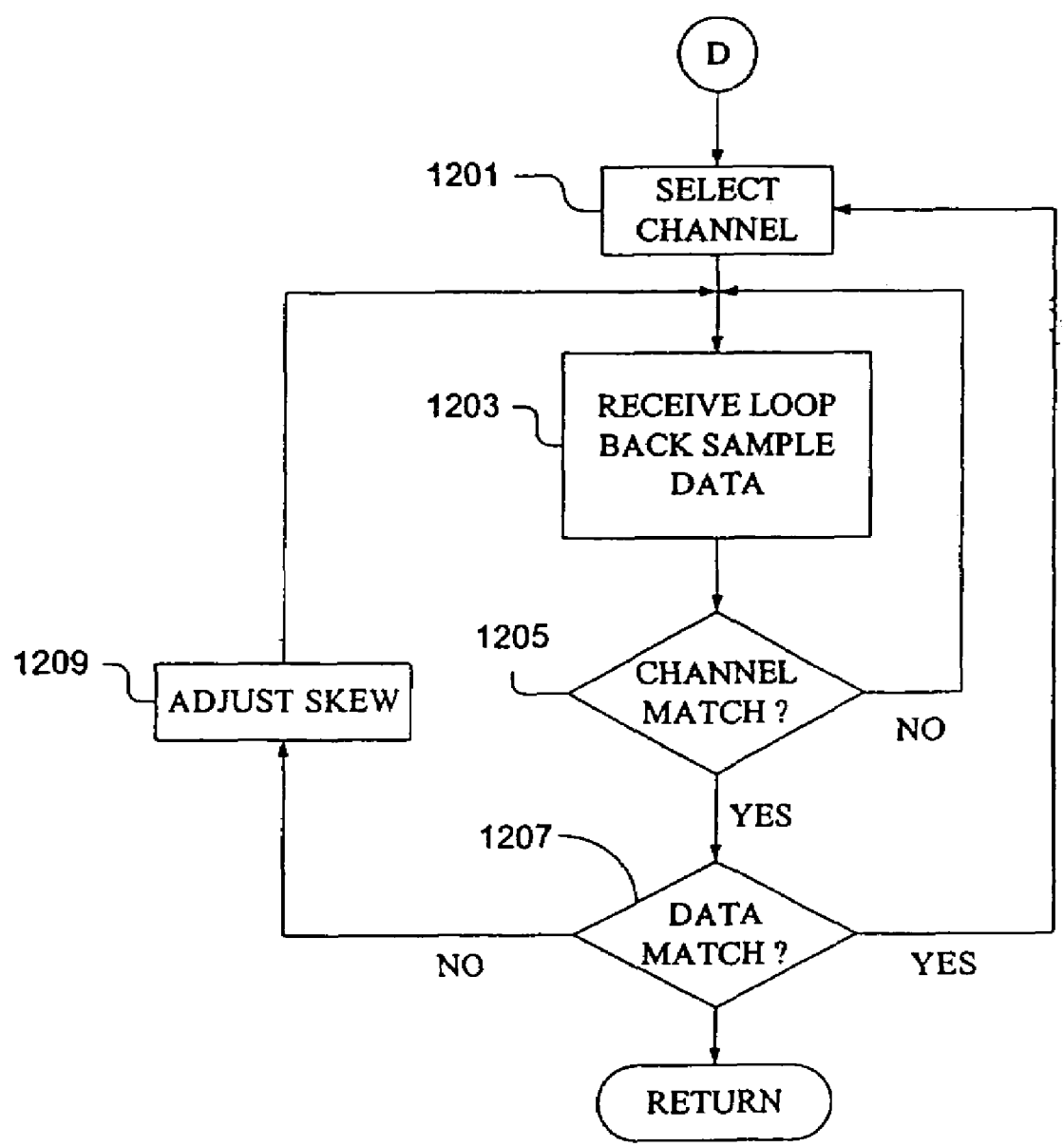
FIG. 19 is a flow diagram of a subprocess for de-skewing the data channels.

FIG. 19 illustrates a flow diagram of a subprocess for de-skewing the remaining data channels. In Block 1201 the process selects a data channel to provide data to the delay element. In Block 1203 the process receives loop back sample data. In Block 1205 the process determines if the loop back sample data corresponds to the selected channel. If the loop back sample data does not correspond to the selected channel, the process returns to Block 1203. If the loop back sample data corresponds to the selected channel, the process compares the data in the loop back sample data with the delayed data from the selected channel in Block 1207. If the data matches, the process returns to Block 1201 and selects another channel. If the data does not match in one embodiment the process determines a skew delay for the data channel based on the results of the comparison. In the embodiment illustrated in FIG. 20 the process adjusts the skew of the selected data channel in Block 1209, and thereafter returns to Block 1203 to await receipt of a further loop back data sample for the selected channel.

Figure 20:
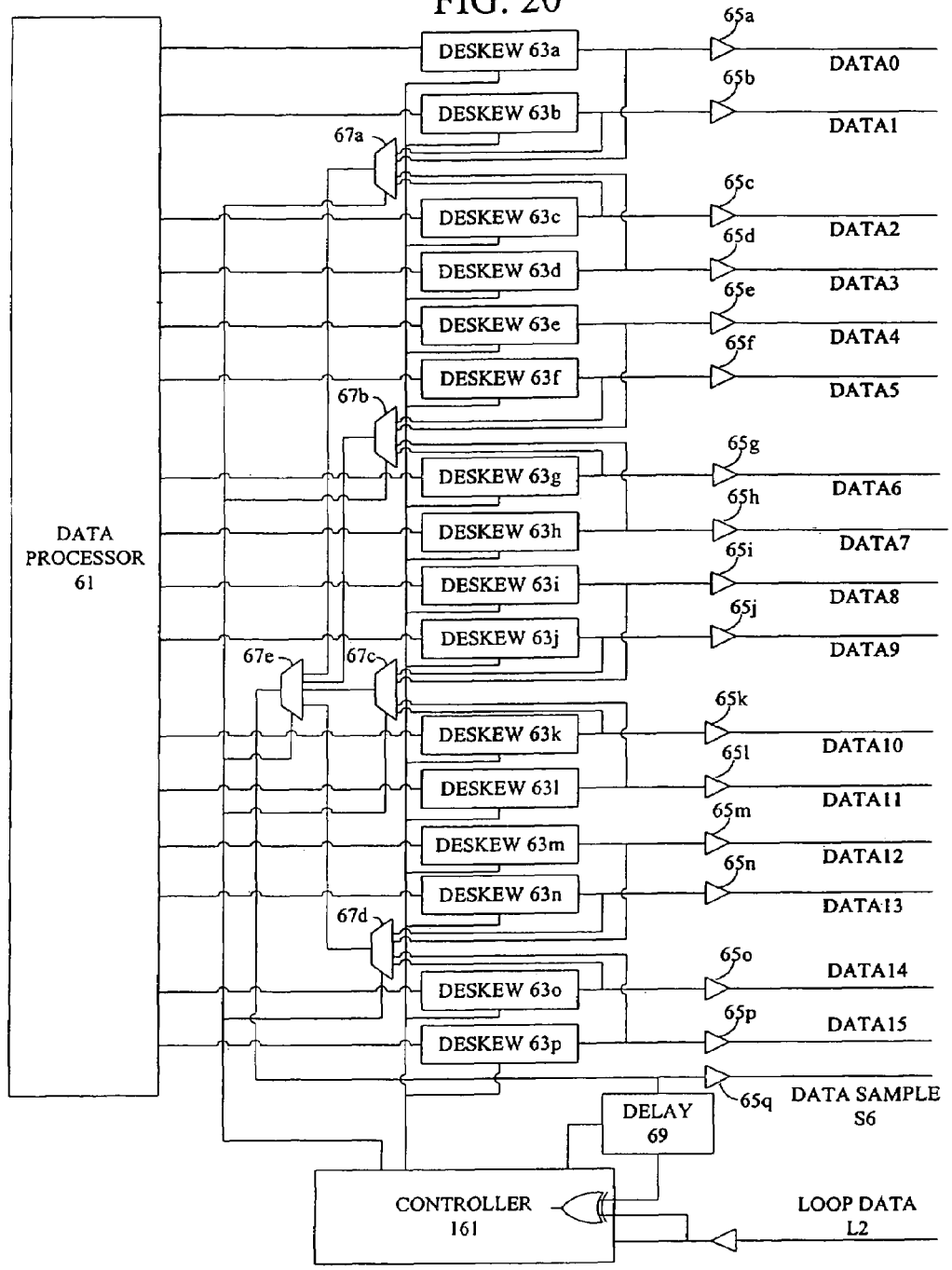
FIG. 20 is a semi-schematic diagram of one embodiment of a processor performing a preskew function.

A semi-schematic diagram of one embodiment of a unit performing a pre-skew function is illustrated in FIG. 20. The unit includes a processor, which in a SERDES, for example, may perform deserialization. The processor provides parallel data to de-skew, or pre-skew, units 63*a-p*. Outputs of the de-skew units are provided to output drivers 65*a-p* for transmission to a processing unit (not shown). Outputs of the de-skew units are also provided to multiplexers 67*a-e* for selection of data from data channels DATA0-DATA15 by a controller 161. The selected data from multiplexers 67*a-d* are provided to multiplexer 67*e* which provides one of selected data to a delay element 69. In one embodiment the delay element is a string of latches, as also may be the case in some embodiments previously described. The delay element contains sufficient delay to approximate the round trip time of data from, for example, a SERDES and returned on the loop back channel L2. The delay element is controlled or adjusted by the de-skew controller.

In a further embodiment, both the upstream unit and the downstream unit include sample generator and de-skew circuitry, and multiple sample/control channels, e.g., data sample channel S6 via buffer 65*g*, are provided between the units. Thus, in various embodiments, a control signal is provided to the units so that one unit performs de-skewing while the other unit performs error monitoring, and also provides additional control signals between the units.

Figure 21:
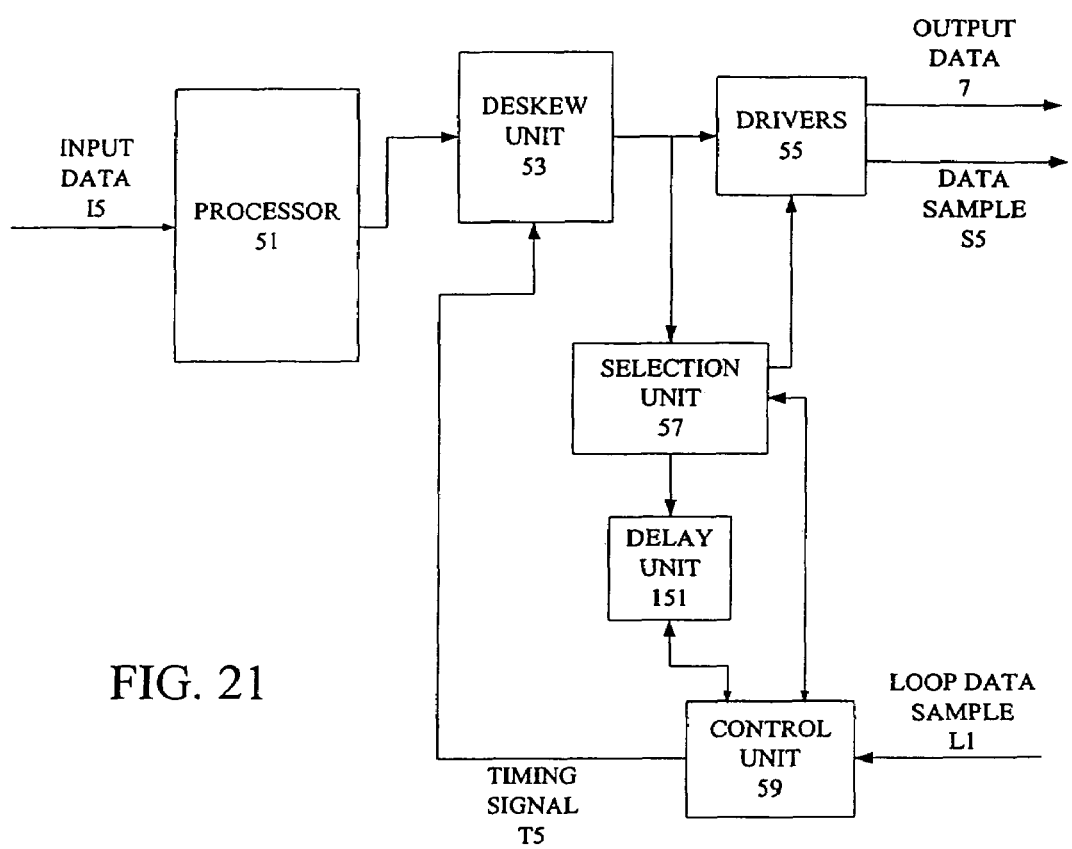
FIG. 21 is a block diagram of an upstream unit performing a preskew function.

In FIG. 21, a processor 51 receives input data I5. The input data, in one embodiment, is information provided via an optical link. More commonly, the information is provided by a parallel interface, thereby reducing processing efforts by higher speed SERDES units. The processing unit de-serializes the data and supplies the data, in parallel form, to a deskew unit 53. Based on a timing signal T5, the deskew unit forwards data to drivers 55. The drivers transmit the data to, in one embodiment, another processing unit (not shown).

The deskew unit also forwards data to a selection unit 57. A control unit 59 is coupled to the selection unit and commands the selection unit to generate or select specific samples or portions of data received from the deskew unit. In one embodiment, the data selection is performed in a round-robin fashion. The selection unit aggregates the samples of data to form a data sample signal S5. The selection unit transmits the data sample signal to the drivers 55 and a delay unit 151. The delay unit is adjustable by the control unit and adjusts the timing of the data sample signal. The delayed sample signal is then supplied to the control unit.

The control unit also receives a loop data sample L1. The control unit compares the loop data sample to the delayed data sample. Based on the comparison of the loop data sample and the delayed data sample, the control unit generates the timing signal. As such, the control unit is able to adjust the data from the deskew unit to be synchronized with the timing of the loop data sample.

Figure 22:
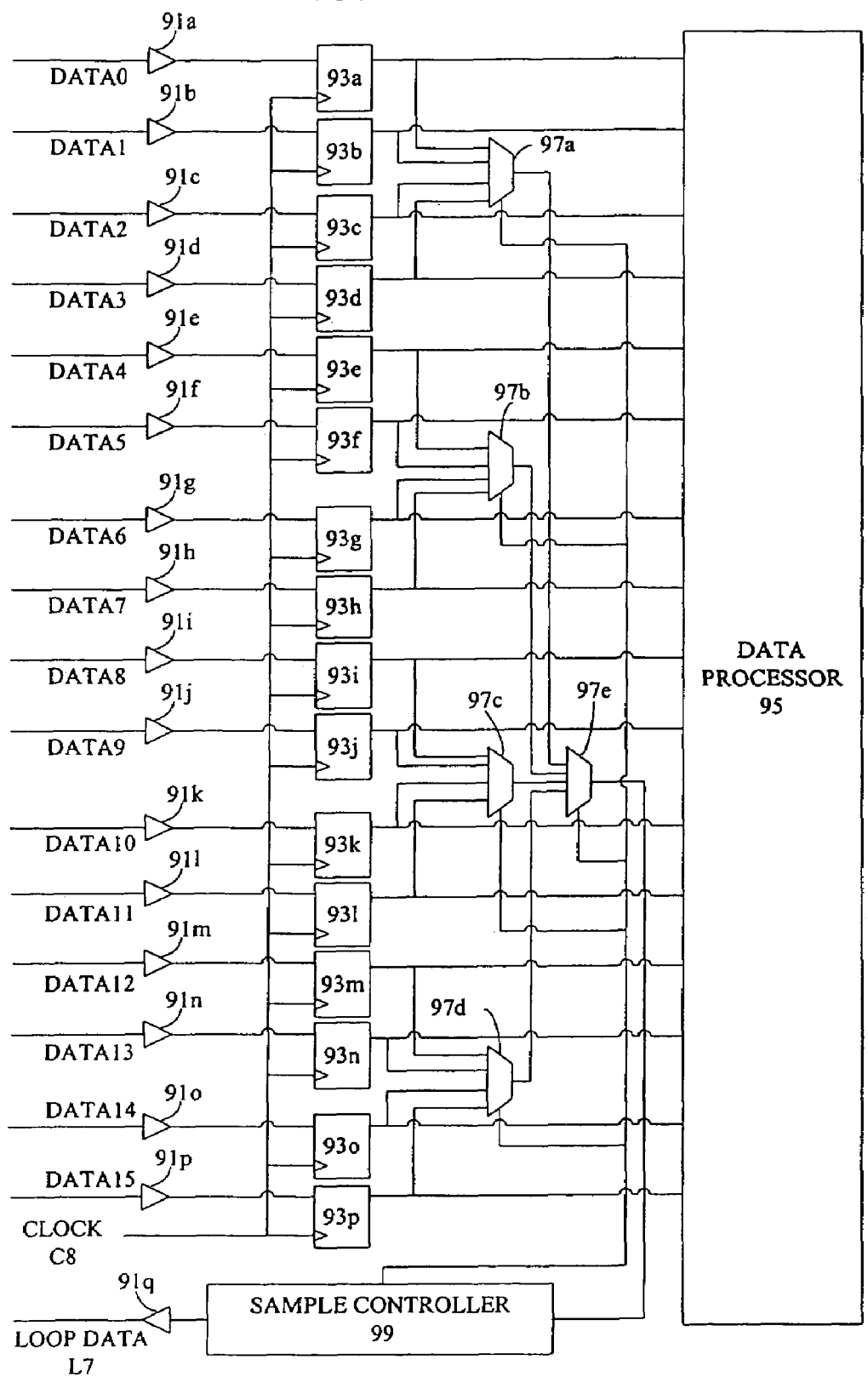
FIG. 22 is a semi-schematic diagram of one embodiment of a downstream unit providing a loop-back data sample.

FIG. 22 illustrates a semi-schematic diagram of one embodiment of a downstream unit. In FIG. 22, a data processor 95 receives signals on data channels DATA0-DATA15. The signals are provided to buffers 91*a-p*, and then to latches 93*a-p*. The output of the latches is provided both to a data processor 95 and multiplexers 97*a-d* under control of a sample controller 99, as described with respect to the SERDES of FIG. 5. Also, the sample controller provides the data to another unit, in this case, the SERDES, on a sample channel, i.e., the loop back sample channel L7 from multiplexer 97*e* and via buffer 91*g*.

Figure 23:
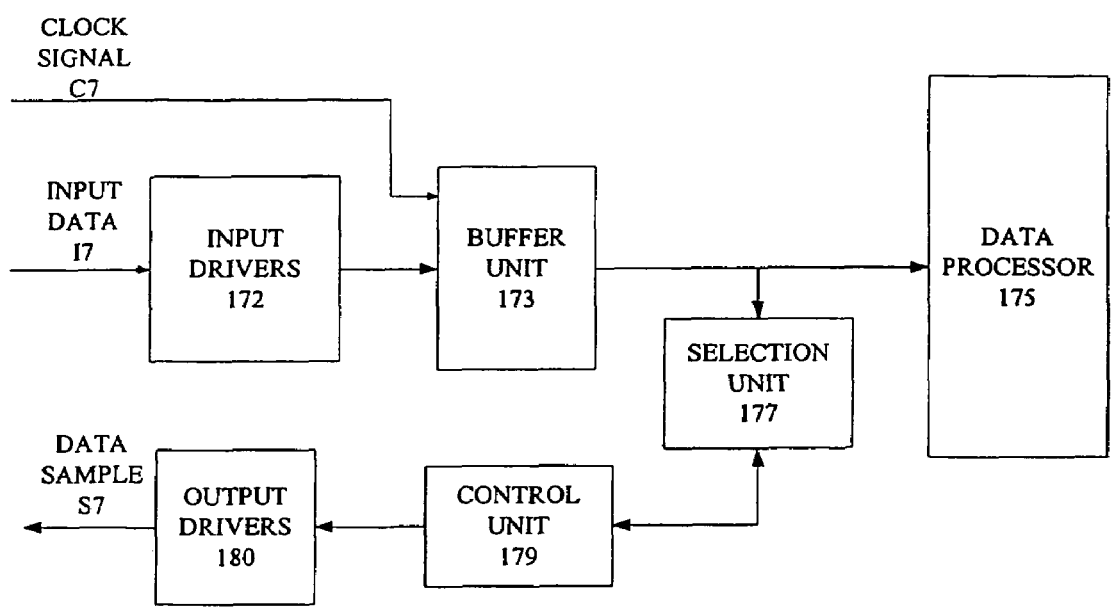
FIG. 23 is a block diagram of one embodiment of a downstream unit providing a loopback sample data.

In the alternative embodiment the processing unit performs functions analogous to the functions described with respect to the process of FIG. 4. Accordingly, and as illustrated in FIG. 23, input drivers 172 receive input data I7. The input data, in one embodiment, is information provided from a SERDES (not shown). The input data is in parallel form and, in one embodiment, includes sixteen data channels. The input drivers supply the parallel data to a buffer unit 173.

A clock signal C7 is also supplied to the buffer unit. Based on the clock signal, the buffer unit transmits the data to a data processor 175. The buffer unit also forwards data to a selection unit 177. A control unit 179 is coupled to the selection unit and commands the selection unit to generate or select specific samples or portions of data received from the buffer unit. In one embodiment, the data selection is performed in a round-robin fashion. The control unit aggregates the samples of data to form a data sample signal. The data sample signal is supplied to output drivers 180 which, in one embodiment, transmits the data sample S7 to a SERDES (not shown).

Figure 24:
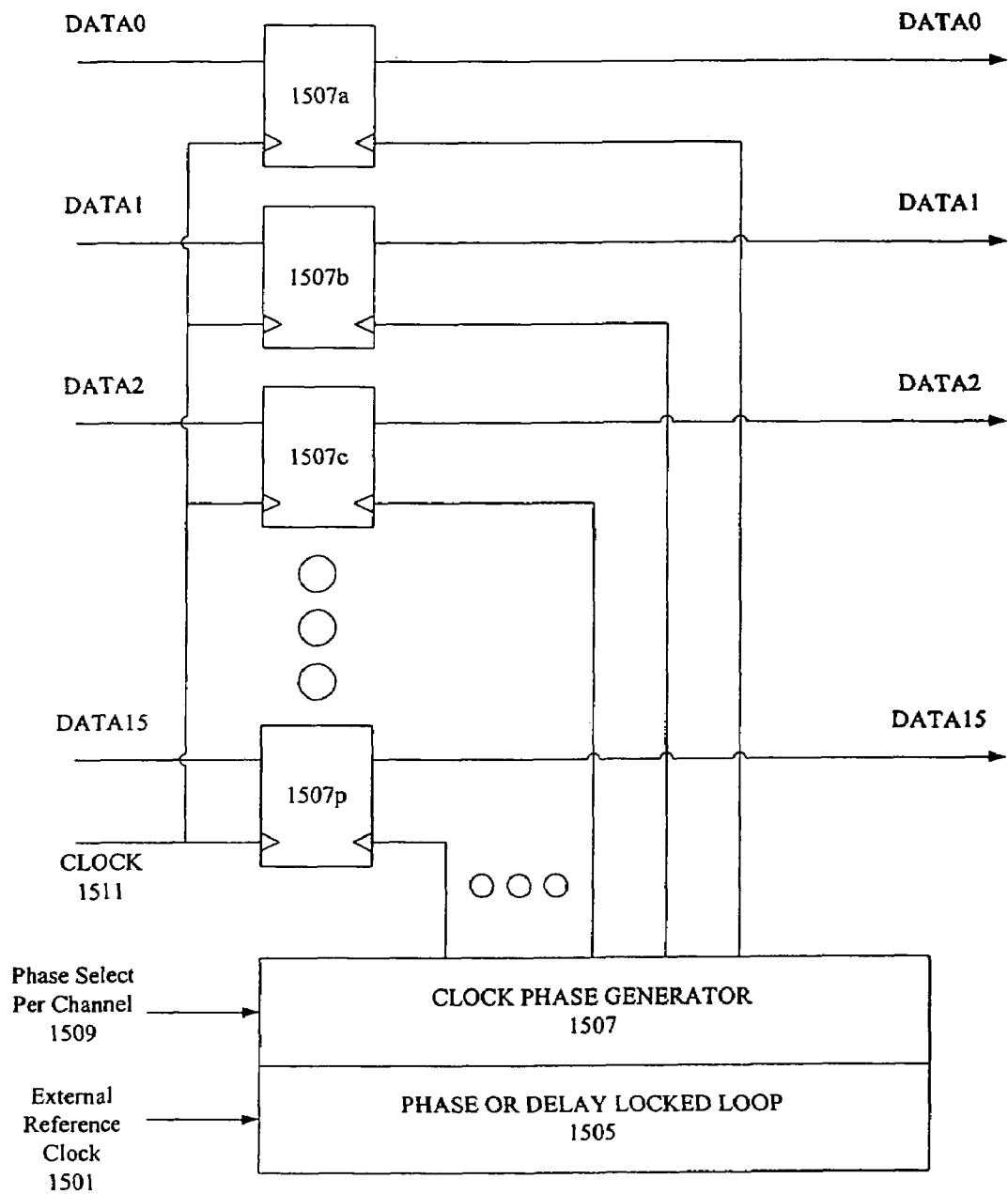
FIG. 24 is a semi-schematic diagram of portions of a unit performing a de-skew or pre-skew operations.

FIG. 24 illustrates portions of a deskew, or preskew, function. Each of 16 parallel data lines are provided to buffers 1507. The buffers may take the form, for example of FIFOs, including tapped FIFOs. Each of the FIFOs receive potentially varying control or clocking signals, allowing for alignment and synchronization of the parallel data lines.

Referring somewhat more specifically to the embodiment of FIG. 24, in FIG. 24 an external reference clock 1501 is supplied to a phase-locked loop (PLL) or digital locked loop. (DLL) 1505. The PLL or DLL is coupled to a clock phase generator 1503. The phase-locked loop circuit ensures that the clock signal supplied to the clock phase generator does not vary, e.g., remains in phase, from the external reference clock. In one embodiment, the external reference clock 1501 is supplied directly to a clock phase generator 1503.

The clock phase generator slices the reference clock. In the embodiment described, the phase generator creates a number of clock signals, each of the same frequency, but phase-shifted with respect to each other. Thus, in one embodiment the clock phase generator creates the external reference clock into sixteen clock signals, each phase shifted 22.50 degrees from another clock signal.

The clock phase generator supplies an output signal to each FIFO unit 1507*a*-1507*q*. Each output signal is based on the sixteen clock signals. In one embodiment the output signal is merely one of the sixteen clock signals. In another embodiment the output signal is a weighted sum of the sixteen clock signals, in one instance as is described in U.S. patent application Ser. No. 09/265,725, the disclosure of which is hereby incorporated by reference. A phase select per channel signal 1509 selects, or determines, the clock signal, or weights of clock signals, for the output signal supplied to each FIFO unit for each channel. In other words, the phase select per channel signal 1509 is supplied to the clock phase generator to select the output from the clock phase generator, e.g., a clock signal from the clock phase generator. The phase select per channel signal is provided by a de-skew controller (not shown in FIG. 24).

The FIFO units also receive a clock signal 1511 and a respective data channel DATA0-DATA15, as inputs. In one embodiment the clock signal has a substantially higher rate than the data rate for the data channels. Information, digital data, on each data channel is clocked into the corresponding FIFO unit by the clock signal. Information on each data channel is then clocked out by the output from the clock phase generator as selected by the phase select per channel signal.

Thus, this allows digital data for each channel to be delayed in a FIFO unit or register for that channel, and released from the register at a time that is a controlled fraction of a clock period. The clock period, which is externally controlled, is not subject to variations due to manufacturing process or environmental variables. Therefore, the de-skew time, the time differences between channels, is referenced to the externally controlled clock. In many instances, it would be desirable for the de-skew time to remain constant. However, there may be cases where unavoidable delays in the data transmission path vary in a known way with environmental variables such as temperature. In this case, the fraction of the clock period used to de-skew the channel could be adjusted to compensate the known dependency in the unavoidable delay. As such, the need for clock recovery on the downstream side of the interface could be reduced.

Figure 25:
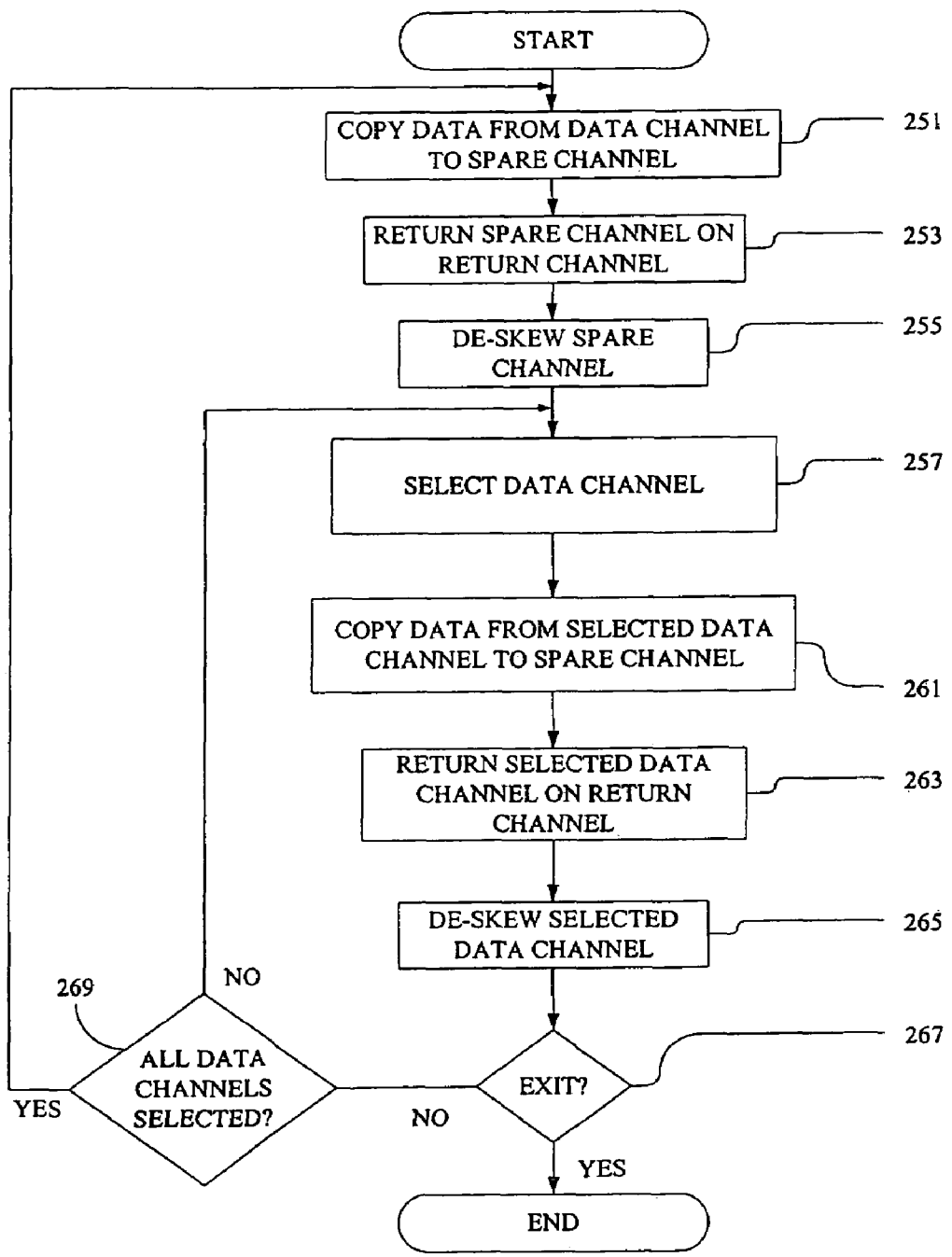
FIG. 25 illustrates a flow diagram of one embodiment of a process for testing and providing data and de-skewing data using a sample channel and a return channel.
Figure 25A:
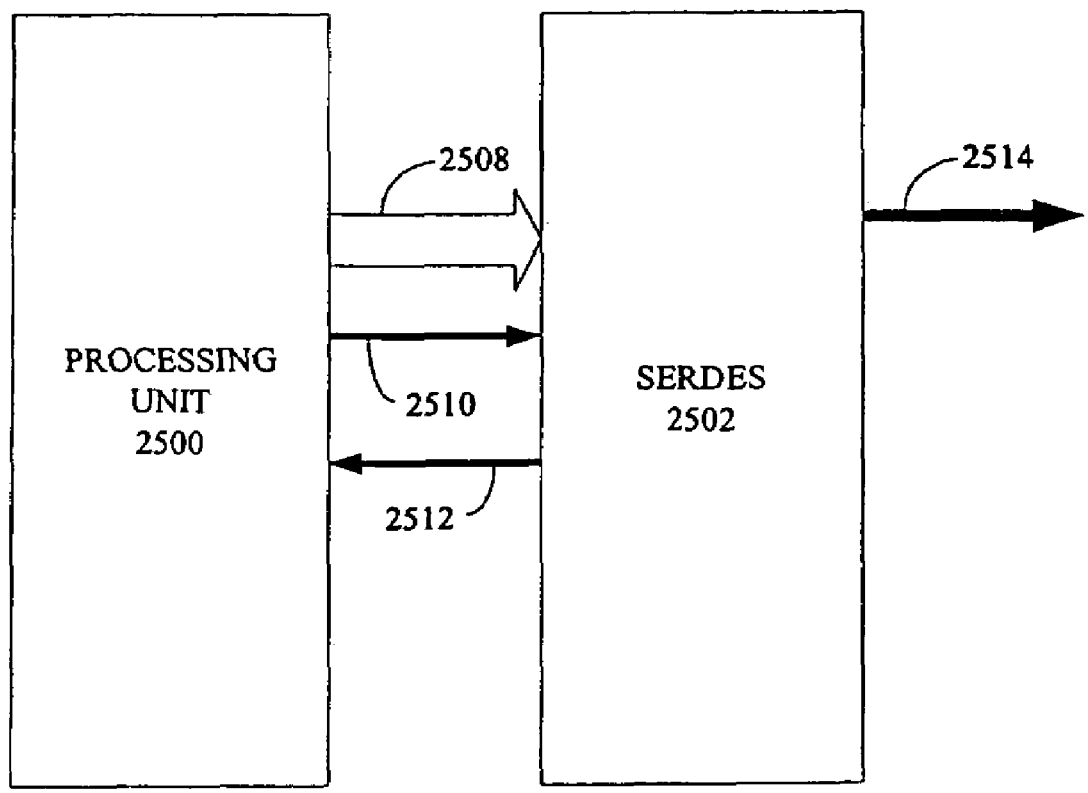
FIG. 25A is a block diagram of a system utilizing a spare channel and a return channel for deskew purposes.

FIG. 25A is a block diagram of two units, with a first unit providing parallel data streams to a second unit. The first unit also provides the second unit a spare signal. The second unit provides the first unit a return signal. The spare signal includes data corresponding to data on various data streams forming the parallel data streams. The return signal includes data provided on the parallel data streams and the spare signal.

As illustrated, the first unit is a processing unit 2500 and the second unit is a SERDES 2502. Accordingly, the SERDES serializes data on parallel data streams 2508 and provides serialized data 2514 over a serial transmission link 2514. A spare data stream 2510 is provided by the processing unit to the SERDES. The SERDES provides a return data stream 2512 to the processing unit.

In operation, data is provided over N of the N+1 lines providing data to the SERDES, with one of the N+1 lines being potentially deskewed at any given instant. Deskew is accomplished by providing data from the line being deskewed back to the processing unit as the return signal, with the processing unit determining preskew for the line. If the line being deskewed provides data meant for further downstream users, the spare channel may be provided data normally provided by the line being deskewed to allow for passage of the data without temporary potential corruption due to the deskewing of the data line.

Figure 25B:
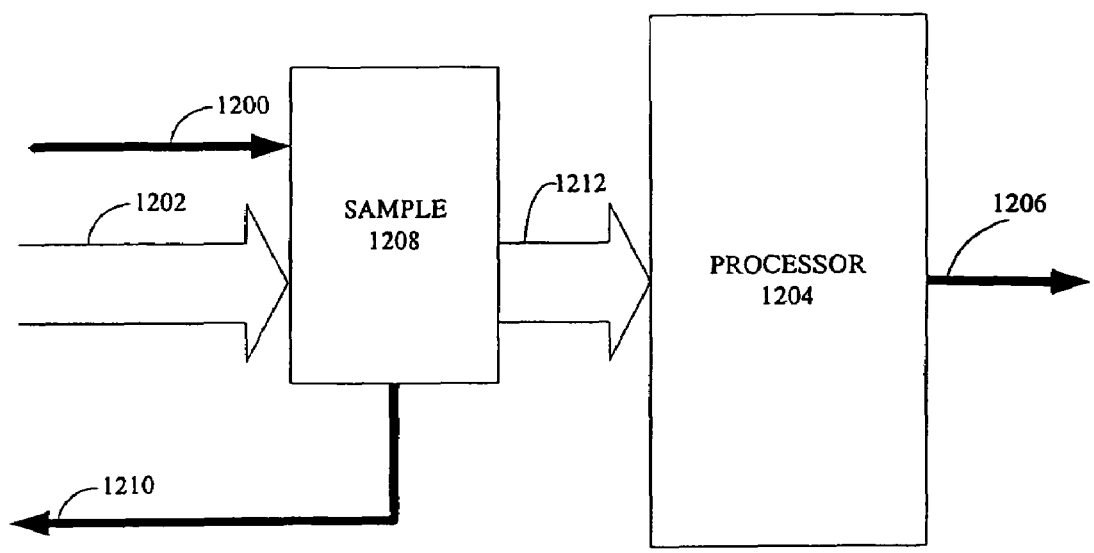
FIG. 25B is a block diagram of a downstream unit of a system utilizing a spare channel a return channel for deskew purposes.

FIG. 25B is a block diagram of an embodiment of a second unit of FIG. 25A. The second unit receives N+1 parallel signals, including N parallel signals 1202 and a spare signal 1200. The parallel signals are provided to a sample unit 1208. The sample unit selects one of the N+1 parallel signals and outputs the selected signal as a return signal 1210. The sample unit also provides N parallel data signals 1212 to a processor 1204. As illustrated in FIG. 25B, the processor outputs a serial signal 1206, and therefore performs a serialization function.

FIG. 25 is a flow diagram of an embodiment of a process for performing deskew using a spare channel and a return channel. In Block 253 data is copied from a data channel onto a spare channel. The data channel is one of a plurality of data channels provided by a first unit to a second unit. The spare channel is also provided by the first unit to the second unit. The second unit returns the data on the spare channel to the first unit on a return channel in Block 253. The spare channel is then deskewed by the first unit, using for example preskew techniques earlier discussed.

The process then loops through each of the data channels, deskewing each in turn, although in one embodiment the spare channel is deskewed after deskewing of each data channel. In somewhat more detail, in Block 257 the process selects a data channel. In Block 261 the process copies data from the selected data channel to the spare channel. In Block 263 the process returns, from the second unit to the first unit, the data from the selected data channel on the return channel. The process also acts on the copied data on the spare channel as if it were provided on the data channel. This further ensures use of data on the selected data channel during deskew adjustments to the data channel. In Block 265 the process deskews the selected data channel as earlier discussed.

In Block 267 the process determines if an exit has been commanded. If so the process ends. If no exit has been commanded the process determines if all data channels have been selected in Block 269. If not all data channels have been selected the process selects another data channel in Block 257 and continues. If all data channels have been selected the process returns to Block 251 and repeats.

Figure 26:
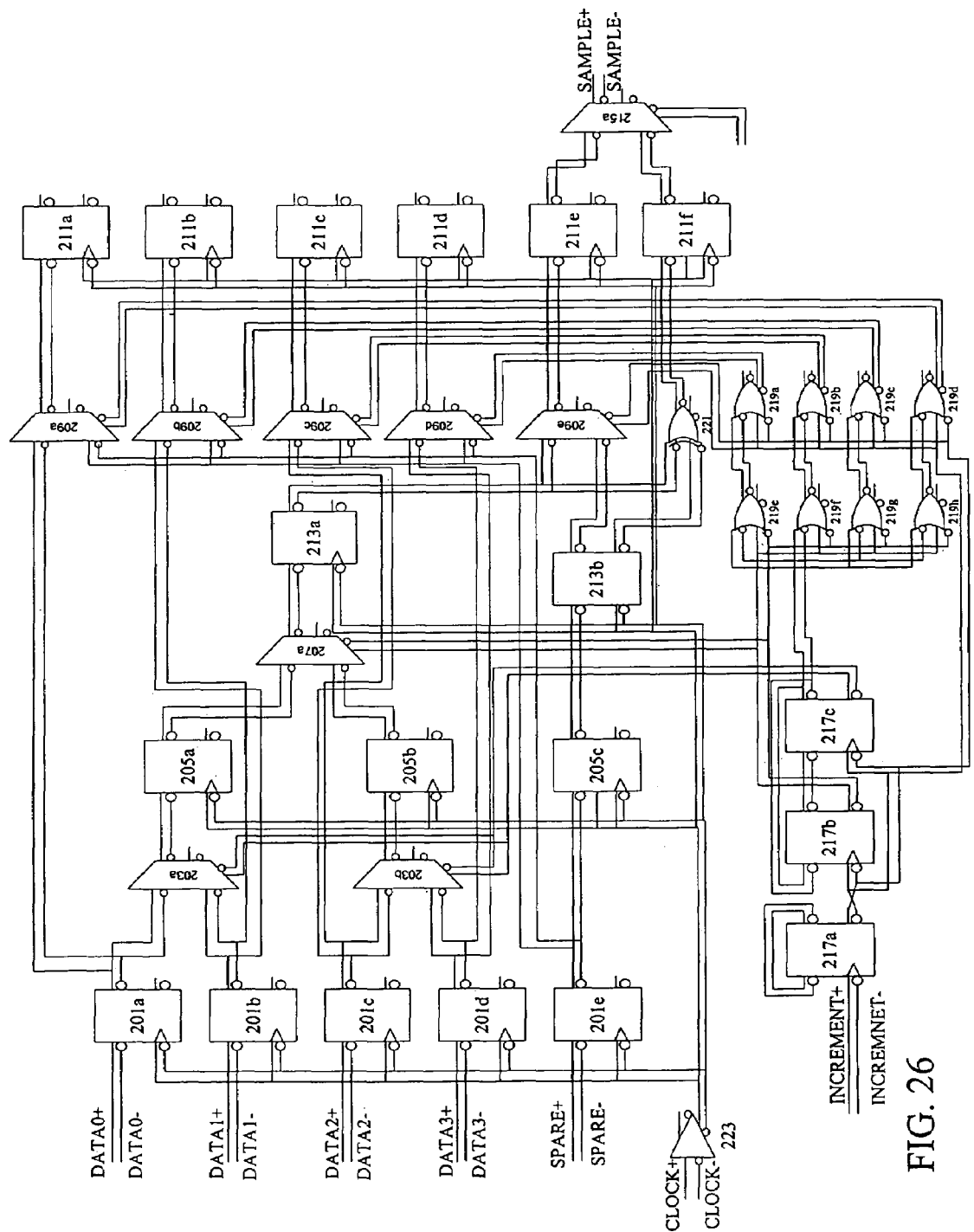
FIG. 26 is a schematic of one embodiment of a unit providing a return signal.

FIG. 26 is a gate level diagram of one embodiment of a circuit providing data channels and a sample channel. For readability, only four data channels DATA0-DATA3 are shown, but, as one skilled in the art would recognize, numerous data channels with associated logic gates could be added in accordance with the illustrated embodiment. Latches 201a-201d receive data from data channels DATA0-DATA3. In the embodiment shown, the data channels provide differential inputs. The embodiment illustrated also provides for a spare channel input, and latch 201e receives data from a spare data channel SPARE0. As with the other data channels, the spare data channel provides differential inputs. A differential clock signal is also supplied to each of the latches 201a-201e via buffer 223.

The outputs of latches 201a-201d are coupled to respective 2×1 differential multiplexers 209a-d. As such, in one embodiment, at a rising or falling edge of the clock signal, the buffers are triggered. Thus, the data on the data channels DATA0-DATA3 are supplied to respective multiplexers 209a-d from latches 201a-d. Latch 201e is also coupled to each multiplexer 209a-d. Thus, at the rising or falling edge of the clock signal, the data on the spare data channel is also provided to the multiplexers 209a-d.

The multiplexers are coupled to latches 211a-d. Selection signals are provided to the multiplexers 209a-d. Based on the selection signals supplied to each multiplexer, a set of inputs are chosen and supplied to the respective latches 211a-d. The latches 211a-d are also supplied the differential clock signal via buffer 223. At the rising or falling edge of the clock signal, the selected inputs from the respective multiplexers are clocked out of the buffers as outputs for the selection unit. Thus, the multiplexers 209a-d allow for selection of the corresponding data channel or the spare channel based on the selection signals.

Buffers 201a-201b are also coupled to a first multiplexer 203a. Similarly, latches 201c-d are coupled to a second multiplexer 203b. The first and second multiplexers are respectively coupled to latches 205a-205b. Selection signals are provided to both multiplexers. Based on the selection signals, a particular input or set of inputs are chosen. The selected input or inputs are supplied to the respective latches 205a-205b. The latches 205a-205b also receive the differential clock signal. In one embodiment, at a rising edge of the clock signal the buffers output the selected inputs to a third multiplexer 207a.

Similar to the other multiplexers, the third multiplexer receives selection signals and is coupled to a latch, latch 213a. As such, based on the selection signals, a set of inputs are selected and supplied to the latch 213a. The latch 213a also receives the differential clock signal and, in one embodiment, at a rising edge of the clock signal, the latch outputs the selected inputs to a multiplexer 209e. Thus, in operation the multiplexers 203a, 203b, and 207a serve as a 4×1 multiplexer, albeit with a delay. The effective 4×1 multiplexer selects one of the four data inputs and places it on a path allowing for placement on the return, or sample, channel.

The multiplexer 209e also receives data from the spare data channel via latches 201e, 205c and 213b. Each latch also receives the differential clock signal from buffer 223. Accordingly, at the rising or falling edge of the clock signal, the data on the sample data channel is also provided to each latch in succession, latch 201e to latch 205c to latch 213b, and finally to the multiplexer 209e.

The multiplexer 209e is also coupled to a latch 211e. Selection signals are provided to the multiplexer 209e. As such, based the selection signals, a set of inputs, e.g., from latch 213a, the data from data channels DATA0-DATA3, or from latch 213b, the data from spare data channel SPARE0, are chosen and supplied to-the latch 211e. The latch 211e is also supplied the clock signal. At the rising or falling edge of the clock signal, via the latch 211e, the selected inputs from the multiplexer, is supplied to another multiplexer 215a. The multiplexer 215a also receives input from a latch 211f. The latch 211f is coupled to outputs of an XOR gate 221. The XOR gate compares (exclusive ORs) the outputs from the latches 213a and 213b, data from the spare data channel and the data from one of the data channels DATA0-DATA3. The XOR gate thereby simplifies spare channel to data channel comparison. The latch 211f also receives the differential clock signal and thus at the rising or falling edge of the clock signal, the latch 211f provides the output from the XOR gate to the multiplexer 215a.

The multiplexer 215a also receives selection signals. In one embodiment, the selection signals are supplied by a controller (not shown). Based on the selection signals, a set of inputs from the latches 211e or 211f are selected and supplied as an output of the selection unit. Accordingly, input data from the data channels DATA0-DATA3, from the spare data channel SPARE0, or the comparison of the data from the data channels to the data from the sample data channel, is supplied as an output from the selection unit.

The selection signals supplied to the multiplexers 203a,b are generated by a series of latches 217a-c coupled together. Similarly, the selection signals supplied to the multiplexer 207a are supplied by latch 217b. The first latch 217a, in one embodiment, receives increment signals from a controller (not shown). A set of the first latch's outputs is fed back as inputs to the latch. As such, the first latch acts as a counter and is triggered by the increment signals. Another set of the first latch's outputs are also supplied to the second latch 217b, the third latch 217c and inputs to OR gates 219a-d. Furthermore, the set of first latch's outputs are also supplied to the multiplexer 209e, as selection signals. Outputs from a corresponding set of OR gates 219e-h also supply inputs to the respective OR gates 219a-d. The outcome or outputs of the OR gates 219a-d are the selection signals to multiplexers 209a-d, respectively.

The outputs of the OR gates 219e-h depend on outputs from the latches 217b and 217c. The output from the latch 217c is also fed back as an input to latch 217b. Thus, the latches 217a-c act as counters and are triggered or count up based the increment signals supplied to latch 217a. Therefore, the latch and OR gates provide control to select data, data samples or a comparison of data samples by generating the appropriate selection signals. As such, input data from the data channels DATA0-DATA3, the spare data channel SPARE0 and a comparison of the data from the data channels DATA0-DATA3 and the sample data channel, outputs from the selection unit via a series of multiplexers and buffers based on the timing of the edges of the clock signal and the value of the selection signals.

In one embodiment, and as illustrated in FIG. 26, the selection signals are based on the increment signal. The increment signal is provided to latch 217a, and latches 217 and XOR gates 219 act on the increment signal and/or resulting signals to form the selection signals. In one embodiment the increment signal is provided by a controller, or a sample unit, in the upstream device. Beneficially, in one embodiment a signal is returned to the upstream device, with the signal generated by the XOR gates, so as to inform the upstream device as to the status of the selection signals and information related thereto.

In one embodiment, the data on data channel DATA0 is copied on to the return channel RDATA. Specifically, data on the data channel DATA0 is supplied to multiplexer 215a via buffers 201a, 205a, 213a and 211e, and multiplexers 203a, 207a and 209e for output at the return channel RDATA. The selection signals to each of the respective multiplexers 203a, 207a and 209e are logic zeros. As such, the first set of inputs, i.e., data from data channel DATA0, are selected. At each rising or falling clock edge the data is clocked through the buffers 201a, 205a, 213a and 211e. Thus, in the embodiment shown, in four clock cycles, the data from data channel DATA0 is supplied to the inputs of multiplexer 215a.

The selection signal coupled to multiplexer 215a is also logic zero and thus the data is transferred to the return channel RDATA and then returned. In one embodiment, the data is returned to a processing unit (not shown). In one embodiment the processing unit receives the returned data and de-skews the data. The de-skewed data is then transmitted which is received by the downstream device via the input spare data channel.

Thus, the data present on data channel DATA0 may again be copied on to the return channel RDATA. The input spare channel SPARE is selected and output from the output data channel OUT0. Specifically, data from the spare channel SPARE is received and provided to the buffer 211a, via buffer 201e and multiplexer 209a. The increment signal coupled to buffer 217a is activated which causes the buffer to count up. Thus, a logic one is provided to each of the OR gates 219a, b, c, d which in turn provides a logic one to respective multiplexers 209a-e. As such, data from the input spare data channel is selected and supplied to buffer 211a. Within two clock periods the data is output from the output data channel OUT0. The data copied on the output spare channel is returned and the data is de-skewed.

The data from the data channel DATA0 is then selected and output from the output data channel OUT0. Specifically, data from the data channel DATA0 is received in buffer 201a and provided to the buffer 211a, via multiplexer 209a. The selection signal provided to the multiplexer 209a remains a logic one and thus the data from the data channel DATA0 is selected and passed to the buffer 211a. In about two clock cycles, the data is output via output data channel OUT0.

The data from data channel DATA1 is copied on to the return channel RDATA. Specifically, data on the data channel DATA1, is supplied to multiplexer 215a via buffers 201c, 205b, 213a and 211e, and multiplexers 203b, 207a and 209e for output at the return channel RDATA. The selection signals to each of the respective multiplexers 203b, 207a and 209e are logic zeros. As such, the first set of inputs, i.e., data from data channel DATA1, are selected. At each rising or falling clock edge the data is clocked through the buffers 201c, 205b, 213a and 211e. Thus, in the embodiment shown, in four clock cycles, the data from data channel DATA1 is supplied to the inputs of multiplexer 215a.

The selection signal coupled to multiplexer 215a is also logic zero and thus the data is transferred to the return channel RDATA and then returned. In one embodiment, the data is returned to a processing unit (not shown). In one embodiment the processing unit receives the returned data and de-skews the data. The de-skewed data is then transmitted and, in one embodiment, received by the selection unit via the input spare data channel.

If another data channel, e.g., data channel DATA1, is to be selected the process repeats. For instance, assume data from data channel DATA1 is selected next. The counter of buffers 217a-c, are incremented and the selection signal provided to multiplexer 209c, selects the data from data channel DATA1.

Data from data channel DATA3 is copied onto the return channel and returned. The counter is incremented again, such that the selection signal provided to multiplexers 203b, 207a and 209e select the data from the data channel DATA3 to be provided to the output spare data channel RDATA. The returned data is then de-skewed.

Data channel DATA3 is then selected. The counter of buffers 217a-c, are incremented and the selection signal provided to multiplexer 209d, selects the data from data channel DATA3. Thus, data is output via output data channel OUT3.

Data from data channel DATA2 is copied onto the return channel. For example, the counter is incremented, such that the selection signal provided to multiplexers 203a, 207a and 209e select the data from the data channel DATA2 to be provided to the return data channel RDATA. The returned data is then de-skewed.

Next, data channel DATA2 is selected. The counter of buffers 217a-c, are incremented and the selection signal provided to multiplexer 209b, selects the data from data channel DATA2. Thus, data is output via output data channel OUT2.

Data from data channel DATA0 is copied onto the return channel and returned. The returned data is then de-skewed. The process continuously repeats, such that all the data channels are selected, returned and de-skewed. If all the data channels have been de-skewed, in one embodiment, the process ends.

Figure 27:
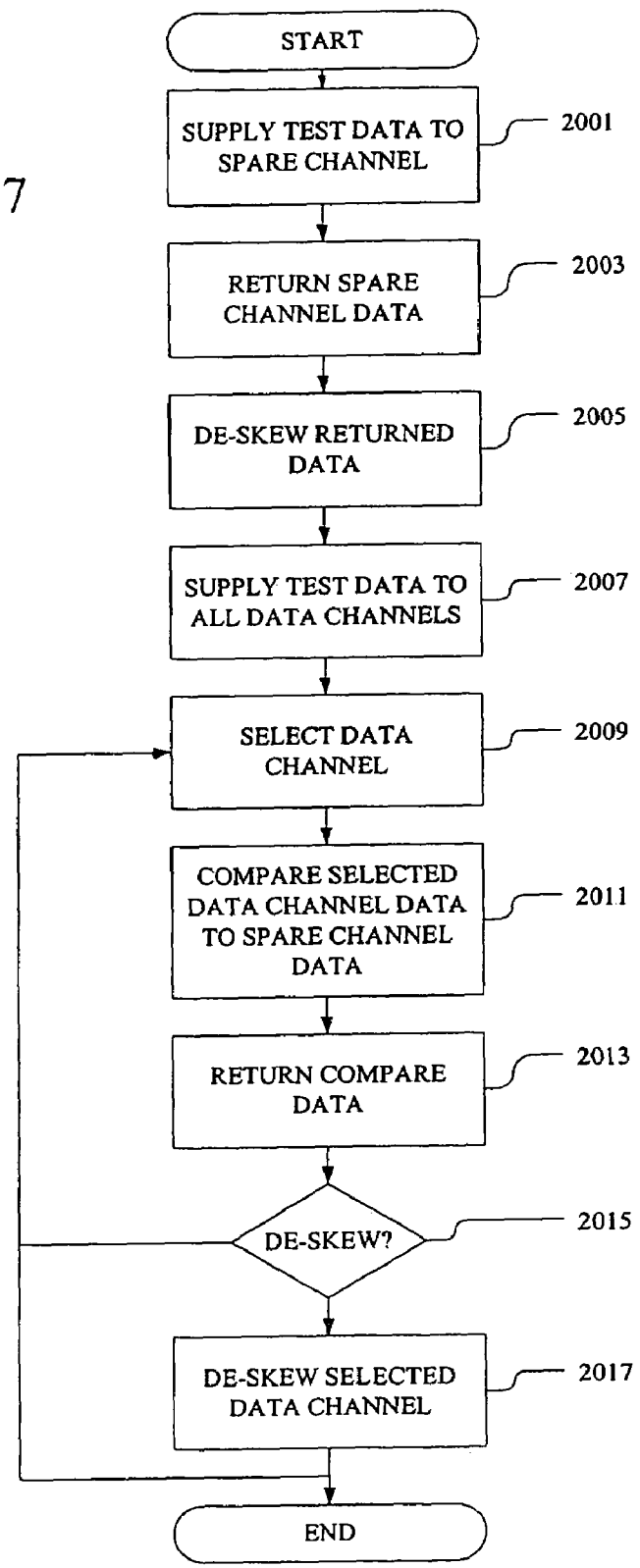
FIG. 27 is a flow diagram of another embodiment of a process for testing and providing data and de-skewing data using a data sample.

FIG. 27 illustrates a flow diagram of another embodiment of de-skewing data channels. In block 2001, a test data channel supplies data to the spare data channel SPARE. The data is output via the return channel RDATA, in block 2003. The data from the return channel RDATA is then de-skewed by observing the returned data, in block 2005. In block 2007, a predetermined test data is provided to all data channels, i.e., data channels DATA0-DATA3. In block 2009, one of the data channels is selected and the received test data is XOR'ed to the spare data channel by XOR gate 221, in block 2011. The output of the XOR gate is returned via buffer 211f and multiplexer 215a, in block 2013. The output of the XOR gate is then observed to determine if the selected data channel should be de-skewed, in block 2015. If so, the selected data channel is de-skewed, in block 2017. Otherwise or once the selected data channel is de-skewed, the process is repeated by continuing to block 2009, such that all the data channels are selected and de-skewed. As such, each data channel is selected in turn and the received test data is XOR'ed to the spare data channel and the output observed for de-skew. In one embodiment, the process continuously repeats.

In one embodiment, as illustrated in FIG. 28, the data sample frame includes a header containing a fixed pattern, the replicated channel number, the sample length and a status word. The remainder of the frame includes a fixed quantity of data sample from the selected data channels. In one embodiment, where interfaces use a symmetric de-skew hardware replacement, the header is not utilized. As such, one extra signal, the clock signal, is supplied to indicate the start of the data sample switching to the first channel. The period of the clock would be the number of channels times the sample size.

Referring again to FIG. 28, the header includes a thirty-two bit frame delimiter H1 containing the pattern of A1A1A2A2. Following the delimiter, eight bits are provided to indicate the channel number CH, i.e., the channel from which the sample data will be taken. The sample length SL is indicated by an eight bit word. In one embodiment, the length of a sample is indicated in thirty-two bit words. Finally, a sixteen-bit status word ST0 and ST1 is provided to indicate, for example, errors. Accordingly, the total header size is sixty-four bits in the illustrated embodiment. A sixty-four bit data sample D00-D03 follows the header.

For a skew tolerance of eight bit times, the de-skew time was approximately 128 bit times plus 128 bit times per channel. As such, a sixteen bit bus would require approximately 2200 bit times to de-skew. At a typical protocol rate that is approximately 900 nano seconds. Larger skews based on different applications of the system may require linearly increasing amounts of time to de-skew. In order to allow for arbitrary data, the pattern length should exceed the required skew tolerance. For example, a repeating 1010 pattern would allow unique realignment of less than two bits of skew.

For a skew tolerance of eight bit times, the de-skew hardware would require approximately two thousand logic gates for the de-skew controller plus one hundred gates per channel. As such, a sixteen bit data bus would approximately require 3,600 gates to de-skew. Furthermore depending upon the limitation, greater skews may require a greater amount of linearly increasing hardware to de-skew. However, increasing de-skew time could be traded partially for hardware. For interfaces using asymmetric de-skew hardware replacement, the header generation and samples selection hardware would approximately require four hundred gates. For one extra signal, the header could also be eliminated. As such, the selection hardware would be reduced to approximately forty gates.

Figure 29:
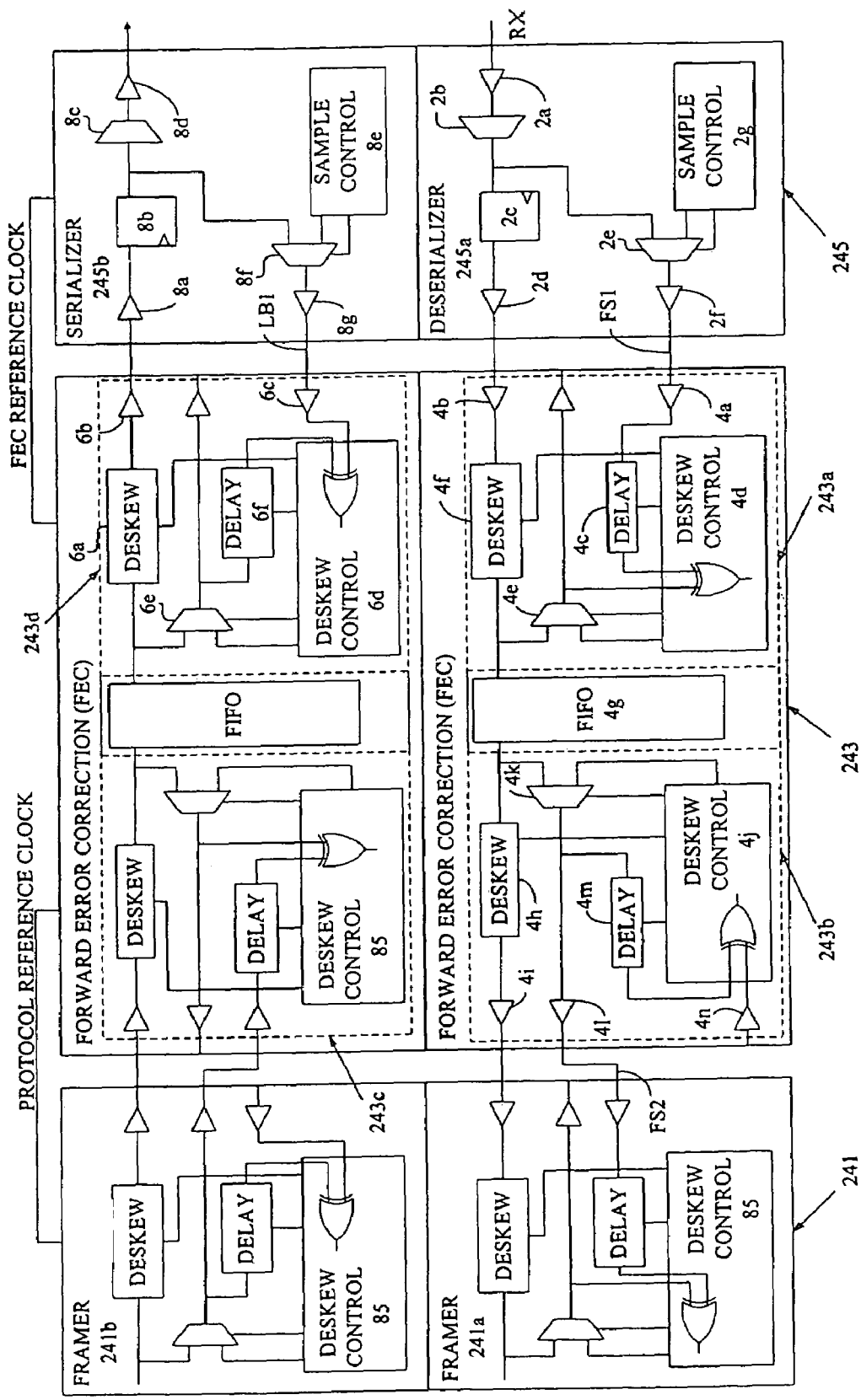
FIG. 29 illustrates a semi-schematic diagram of one embodiment of a system including de-skew functions.

FIG. 29 illustrates a block diagram of one embodiment of a data de-skew system. In this embodiment, the system is separated into three sections, a framer section 241, a forward error correction section 243 and a serializer/deserializer section 245. A deserializer 245a in the serializer/deserializer section receives serial data from an external source (not shown) via a buffer 2a and a multiplexer 2b. The serial data is converted to parallel data channels. Data on the parallel data channels are supplied to a first portion 243a of the forward error correction section via register 2c and buffer 2d. Samples of the data on the parallel data channels are also selected, one at a time in a rotation, and provided on an extra data channel, a forward data sample F51. The forward data sample is composed by the sample control 2g and the multiplexer 2e. The forward data sample is then output from the deserializer via buffer 2f. In one embodiment, the forward data sample includes a header containing a fixed pattern, the specified channel number and a fixed quantity of data sampled from the selected parallel data channels. The parallel data channels are received by the first portion 243a via a buffer 4b. The forward data sample is also received by the first portion via a buffer 4a.

A de-skew control 4d receives the forward data sample through a delay 4c. The de-skew control identifies the header information in the forward data sample and identifies the specified channel. Using multiplexer 4e, the de-skew control collects data from the specified channel and centers the skew adjustment for the specified channel via de-skew unit 4f. The forward data sample is then delayed via the delay 4c by the de-skew controller 4d until the data matches. The forward data sample is then switched to another channel. The de-skew control identifies the channel number and selects the channel via the multiplexer 4e. Subsequently, the skew on the selected channel is adjusted by de-skew 4f until the data matches the forward data sample. As such, all the parallel data channels are rotated once until all the skew on the data channels are adjusted to match the forward data sample. In one embodiment, this continues in order to continuously monitor the interface integrity between the deserializer and the forward error correction sections. The de-skewed data from the parallel data channels are stored in the FIFO 4g.

A second portion 243b of the forward error correction section 243, in one embodiment, also provides a forward data sample F52 and parallel data in a similar fashion as previously described in reference to the deserializer 245a. Data is read from the FIFO 4g and provided to a framer module 241a along parallel data channels via buffer 4i and de-skew unit 4h. The de-skew control 4j and the multiplexer 4k samples and selects data from the parallel data channels to provide the forward data sample F52 via a buffer 4l. In one embodiment, the delay 4m, the buffer 4n, the de-skew control 4j and the de-skew unit 4h are provided to de-skew the parallel data based on data provided via buffer 4n and sampled data. The framer module 241a receives the parallel data and the forward data sample. As such, using the same or similar components as the first portion of forward error correction section, the framer module performs the similar module de-skew operations by comparing the data on the parallel data channels to the forward data sample and adjusts the de-skew each channel.

The framer module 241b and the third forward error correction section also includes similar components and operates in a similar fashion, respectively, to the first portion 243a of the forward error correction section and the framer 241a. As such, the framer 241b provides the parallel data and the forward data sample to the third portion of the forward error correction section. Consequently, the forward error correction section performs skew adjustments on the specified channels to match the received forward data sample.

Thus, the deserializer 245a, the second portion of the forward error correction section and the framer 241b provide forward data samples which includes a header followed by a sample of selected data from the parallel data channels. The first portion of the forward error correction section, the framer 241a and the third portion of the forward error correction section recognizes the header in the forward data sample, decodes and selects the identified data channel in the forward data sample and adjusts the delay of each data channel to de-skew each channel.

The de-skew system, illustrated in FIG. 29, also includes a pre-skew portion. For instance, the fourth portion 243d of the forward error correction section provides parallel data via de-skew unit 6a and buffer 6b. The parallel data is received by the serializer via buffer 8a and register 8b. Via sample control 8e and multiplexer 8f, data from the parallel data channels are sampled and provided to the fourth portion of the forward error correction section via a buffer 8g as a loop back data or reverse data sample LB1. The reverse data sample in one embodiment includes a header followed by a sample selected from the parallel data channel. The fourth portion of the forward error correction section receives the reverse data sample via buffer 6c.

The de-skew control 6d interprets the header information in the reverse data sample and thus selects data from the specified parallel data channel. The de-skew control then causes the de-skew unit 6a to center the skew adjustment for the specified channel. A local data sample is also generated by the de-skew control 6d via multiplexer 6e. Using the delay 6f, the de-skew control adjusts the delay of the local data sample until the data matches the received reverse data sample. In one embodiment, this delay approximates the round trip delay for data transmitted on the parallel data channels. When the reverse data sample switches to the next channel, the de-skew control decodes the channel number, selects that data channel via multiplexer 6e and adjusts the skew on the data channel via de-skew unit 6a until data matches the reverse data sample. Thus, by rotating once through all the parallel data channels, all the parallel data channels are de-skewed. The de-skew operation, in one embodiment, continues to be performed for interface integrity monitoring in between the forward error correction section and the serializer.

Thus, the serializer 245b provides the reverse data sample including a header followed by sample data from selected parallel data channels. The fourth portion of the forward error correction section identifies the header, decodes and selects the identified data channel and adjusts the delay for each identified data channel thereby de-skewing each channel. Since the serializer receives data from the forward error correction module before providing the reverse data sample, the forward error correction module should have a single channel delay capability as large as the data interface from round trip delay in order to perform the de-skew operation.

Therefore, as illustrated in FIG. 29, the de-skew system is able to perform both de-skew and pre-skew operations using respectively a forward data sample or a reverse data sample. The de-skew operation using the forward data sample in one embodiment is the default operation. However, via an external controller (not shown), the reverse data sample could also be used to provide additional integrity monitoring. Additionally, as described above, the data provided between the sections of the de-skew system can be de-skewed at each interface using a forward data sample and/or a reverse data sample in accordance with the de-skew and pre-skew operations described above.

Thus, the present invention provides a de-skew methods and systems. Although described in certain specific embodiments, it should be understood that the present inventions may be practiced otherwise than as specifically described, the bounds of the present invention being set by claims and their equivalents supported by the description herein.

The invention claimed is:

1. A de-skew method comprising:
providing, on a forward data sample channel, a first forward data sample comprising a first channel number and data copied from a first data channel identified by the first channel number;
retrieving data from the first data channel identified by the first channel number;
retrieving the first forward data sample from the forward data sample channel;
adjusting a delay of the first forward data sample until the first forward data sample matches the data from the first data channel; and
using the delay of the first forward data sample to set a delay for the first data channel.

2. The method of claim 1, wherein adjusting a delay of the first forward data sample until the first forward data sample matches the data from the first data channel comprises adjusting the delay of the first forward data sample until a slice of the first forward data sample matches the data from the first data channel.

3. The method of claim 1, wherein the first data channel is one of a plurality of data channels.

4. The method of claim 3, further comprising:
for each data channel of the plurality of data channels other than the first data channel:
determining a channel number for a forward data sample, the channel number being one of a plurality of channel numbers other than the first channel number, the forward data sample being one of a plurality of forward data samples other than the first forward data sample;

retrieving data from a data channel identified by the channel number, the data channel being one of the plurality of data channels other than the first data channel;

retrieving the forward data sample from the forward data sample channel;

adjusting a delay of the forward data sample until the forward data sample matches the data from the data channel; and using the delay of the forward data sample to set a delay for the data channel.

5. A method of deskewing parallel data lines comprising:

providing parallel data over a plurality of parallel data channels;

successively for each of the parallel data channels:

providing sample data over a sample channel, the sample data comprising a channel number of a selected one of the plurality of parallel data channels and data copied from the selected one of the plurality of parallel data channels;

receiving data on the selected one of the plurality of parallel data channels;

receiving the sample data on the sample channel; and using the sample data from the sample channel and the data from the selected one of the plurality of parallel data channels to set a delay for the selected one of the plurality of parallel data channels in order to align the parallel data channels.

6. The method of deskewing parallel data lines of claim 5 wherein the parallel data channels provide parallel data from a first unit to a second unit and the sample channel provides the sample data from the first unit to the second unit.

7. The method of deskewing parallel data lines of claim 5 wherein the parallel data channels provide parallel data from a first unit to a second unit and the sample channel provides the sample data from the second unit to the first unit.

8. The method of claim 5, wherein using the sample data from the sample channel and the data from the selected one of the plurality of parallel data channels to set the delay for the selected one of the parallel data channels in order to align the parallel data channels comprises:

determining a delay of the sample data based on when a portion of the sample data matches a portion of the data received on the selected one of the plurality of parallel data channels; and using the delay of the sample data to set a delay for the one of the plurality of parallel data channels.

9. The method of claim 5, wherein providing sample data over the sample channel comprises:

receiving the sample data in the form of a data packet, the data packet comprising a header and a packet data portion.

10. The method of claim 9, wherein the header comprises the channel number, and wherein the racket data portion comprises the data copied from the selected one of the plurality of parallel data channels.

11. A method of deskewing parallel data lines extending between a first node and a second node, the method comprising:

providing, at the first node, parallel data over a plurality of parallel data channels;

for each of the parallel data channels:

providing, at the first node, sample data over a sample channel, the sample data comprising a channel number identifying one of the plurality of parallel data channels and data copied from the one of the plurality of parallel data channels identified by the channel number, retrieving, at the second node, a first portion of the parallel data of the one of the plurality of parallel data channels identified by the channel number, and using the data copied and the first portion to set a delay for the parallel data channel identified by the channel number in order to align the parallel data.

* * * * *